(12) United States Patent
Ushinaga et al.

(10) Patent No.: US 12,317,011 B2
(45) Date of Patent: May 27, 2025

(54) SOLID-STATE IMAGING ELEMENT, CAMERA MODULE, IMAGE PROCESSING DEVICE, AND IMAGING METHOD

(71) Applicant: Sharp Semiconductor Innovation Corporation, Tenri (JP)

(72) Inventors: Takeo Ushinaga, Tenri (JP); Daisuke Funao, Tenri (JP); Tomonari Kenzaki, Tenri (JP)

(73) Assignee: Sharp Semiconductor Innovation Corporation, Tenri (JP)

( * ) Notice: Subject to any disclaimer, the term of this patent is extended or adjusted under 35 U.S.C. 154(b) by 248 days.

(21) Appl. No.: 18/110,827

(22) Filed: Feb. 16, 2023

(65) Prior Publication Data

US 2023/0269352 A1 Aug. 24, 2023

(30) Foreign Application Priority Data

Feb. 18, 2022 (JP) .................................. 2022-024271
Oct. 31, 2022 (JP) .................................. 2022-174889

(51) Int. Cl.
| | |
|---|---|
| *H04N 9/77* | (2006.01) |
| *H04N 23/88* | (2023.01) |
| *H04N 25/10* | (2023.01) |
| *H10F 39/00* | (2025.01) |

(52) U.S. Cl.
CPC .............. *H04N 9/77* (2013.01); *H04N 23/88* (2023.01); *H04N 25/10* (2023.01); *H10F 39/8023* (2025.01)

(58) Field of Classification Search
CPC .......... H04N 9/77; H04N 23/88; H04N 25/10; H04N 23/843; H04N 25/133; H01L 27/14605; H01L 27/14621
See application file for complete search history.

(56) References Cited

U.S. PATENT DOCUMENTS

| | | |
|---|---|---|
| 2007/0206110 A1 | 9/2007 | Wada |
| 2008/0128598 A1 | 6/2008 | Kanai et al. |
| 2009/0140124 A1 | 6/2009 | Kanai et al. |
| 2010/0134665 A1 | 6/2010 | Kanai et al. |
| 2010/0141813 A1 | 6/2010 | Kanai et al. |
| 2010/0141814 A1 | 6/2010 | Kanai et al. |
| 2012/0307104 A1 | 12/2012 | Kanai et al. |
| 2014/0078357 A1 | 3/2014 | Kanai et al. |
| 2017/0077167 A1 | 3/2017 | Kanai et al. |
| 2020/0043972 A1 | 2/2020 | Kanai et al. |
| 2020/0112705 A1* | 4/2020 | Yokokawa ............. H04N 23/45 |

FOREIGN PATENT DOCUMENTS

| | | |
|---|---|---|
| JP | 2007258686 A | 10/2007 |
| JP | 2007274632 A | 10/2007 |

\* cited by examiner

*Primary Examiner* — Sinh Tran
*Assistant Examiner* — Angel L Garces-Rivera
(74) *Attorney, Agent, or Firm* — ScienBiziP, P.C.

(57) ABSTRACT

A solid-state imaging element synthesizes luminance signals and chrominance signals to obtain an image. The solid-state imaging element includes a plurality of first pixels and a plurality of second pixels. Each of the plurality of second pixels has a spectral response characteristic in white. The solid-state imaging element generates the chrominance signals, using output signals from the plurality of first pixels. The solid-state imaging element generates the luminance signals, using output signals from the plurality of second pixels, without using the output signals from the plurality of first pixels.

11 Claims, 21 Drawing Sheets

5: FIRST PIXEL
19,20: PIXEL PITCH
104: PIXEL ARRANGEMENT
105: PIXEL ARRANGEMENT

| PIXEL ARRANGEMENT | PIXEL ARRANGEMENT 104 | PIXEL ARRANGEMENT 105 | PIXEL ARRANGEMENT 102 |
|---|---|---|---|
| PIXEL ARRANGEMENT | SQUARE-LATTICE ARRANGEMENT | DIAGONAL-LATTICE ARRANGEMENT | DIAGONAL-LATTICE ARRANGEMENT |
| PIXEL PITCH | 2.0 μm | 2.0 μm | 2.0 μm |
| PIXEL SIZE | 2.0 μm | 2.83 μm | 2.83 μm |
| SENSITIVITY (≒PIXEL AREA) | S(REFERENCE) | 2S | 3S |

5: FIRST PIXEL
6: SECOND PIXEL
103: PIXEL ARRANGEMENT

6: SECOND PIXEL
21: THIRD PIXEL
22: FOURTH PIXEL
23: FIFTH PIXEL
24: RECTANGULAR REGION
25: PIXEL GROUP
110: PIXEL ARRANGEMENT

VERTICAL
DIRECTION

↔ HORIZONTAL
DIRECTION

6: SECOND PIXEL
21: THIRD PIXEL
22: FOURTH PIXEL
23: FIFTH PIXEL
24: RECTANGULAR REGION
112: PIXEL ARRANGEMENT

6: SECOND PIXEL
21: THIRD PIXEL
22: FOURTH PIXEL
23: FIFTH PIXEL
24: RECTANGULAR REGION
25: PIXEL GROUP
113: PIXEL ARRANGEMENT

6: SECOND PIXEL
21: THIRD PIXEL
22: FOURTH PIXEL
23: FIFTH PIXEL
24: RECTANGULAR REGION
25: PIXEL GROUP
113: PIXEL ARRANGEMENT

SOLID-STATE IMAGING ELEMENT, CAMERA MODULE, IMAGE PROCESSING DEVICE, AND IMAGING METHOD

TECHNICAL FIELD

The present disclosure relates to a solid-state imaging element, a camera module, an image processing device, and an imaging method The present application claims priority from Japanese Applications JP2022-024271 filed on Feb. 18, 2022, and JP2022-174889 filed on Oct. 31, 2022, the contents of which are hereby incorporated by reference into this application.

BACKGROUND ART

A conventionally known solid-state imaging element synthesizes luminance signals and chrominance signals to obtain an image (Japanese Unexamined Patent Application Publication Nos. 2007-274632 and 2007-258686).

SUMMARY OF INVENTION

The conventional solid-state imaging element generates the luminance signals, using output signals from a plurality of pixels each having different spectral response characteristics. Hence, the conventional solid-state imaging element produces jaggies on the periphery of an image because of chromatic aberration of an imaging lens that concentrates light onto the solid-state imaging element.

As a result, the conventional solid-state imaging element is low in resolution. These jaggies could appear when, in local white balance adjustment processing, a level of an output signal from each of a red pixel and a blue pixel is normalized to a level of an output signal from a green pixel. In other words, these jaggies could appear when the red pixel and the blue pixel are used as the green pixel (a luminance signal).

A solid-state imaging element synthesizes luminance signals and chrominance signals to obtain an image. The solid-state imaging element includes a plurality of first pixels and a plurality of second pixels. Each of the plurality of second pixels has a spectral response characteristic in white. The solid-state imaging element generates the chrominance signals, using output signals from the plurality of first pixels. The solid-state imaging element generates the luminance signals, using output signals from the plurality of second pixels, without using the output signals from the plurality of first pixels.

An aspect of the present disclosure can provide a solid-state imaging element with high resolution.

DESCRIPTION OF EMBODIMENTS

Embodiments of the present disclosure will be described below. For the sake of description, like reference signs are used to denote components having identical functions throughout the embodiments. Such components might not be elaborated upon repeatedly.

First Embodiment

Figure 1:
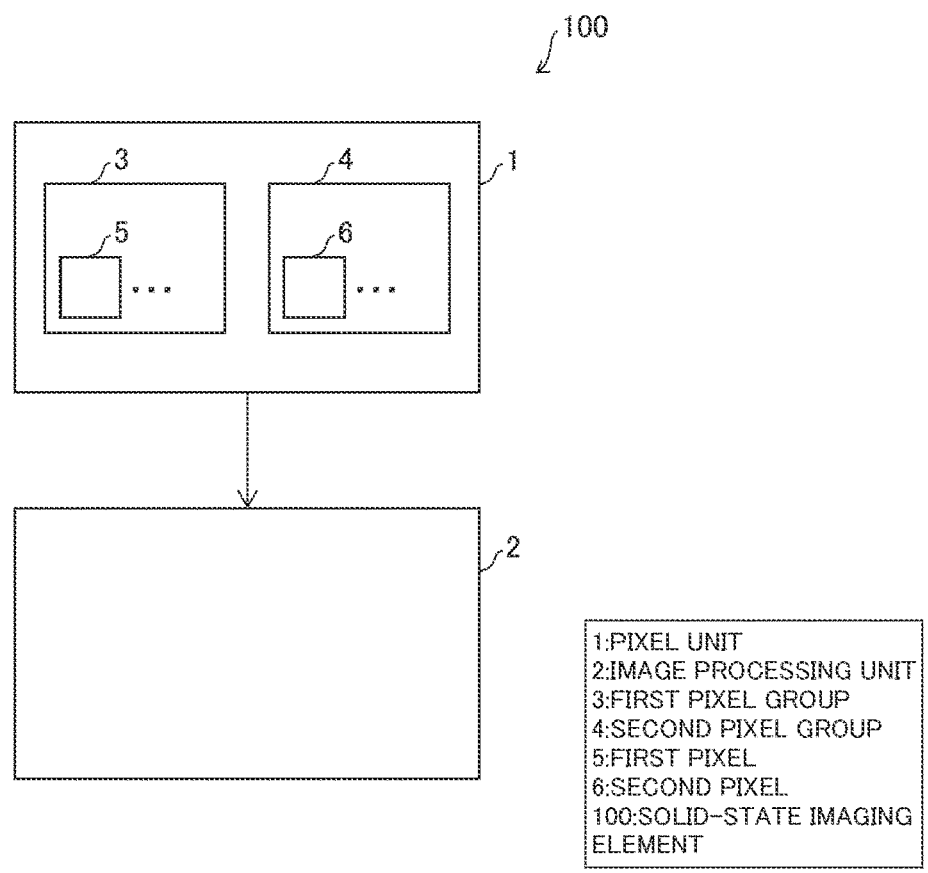
FIG. 1 is a block diagram illustrating a schematic configuration of a solid-state imaging element according to each of first to twelfth embodiments of the present disclosure.
Figure 2:
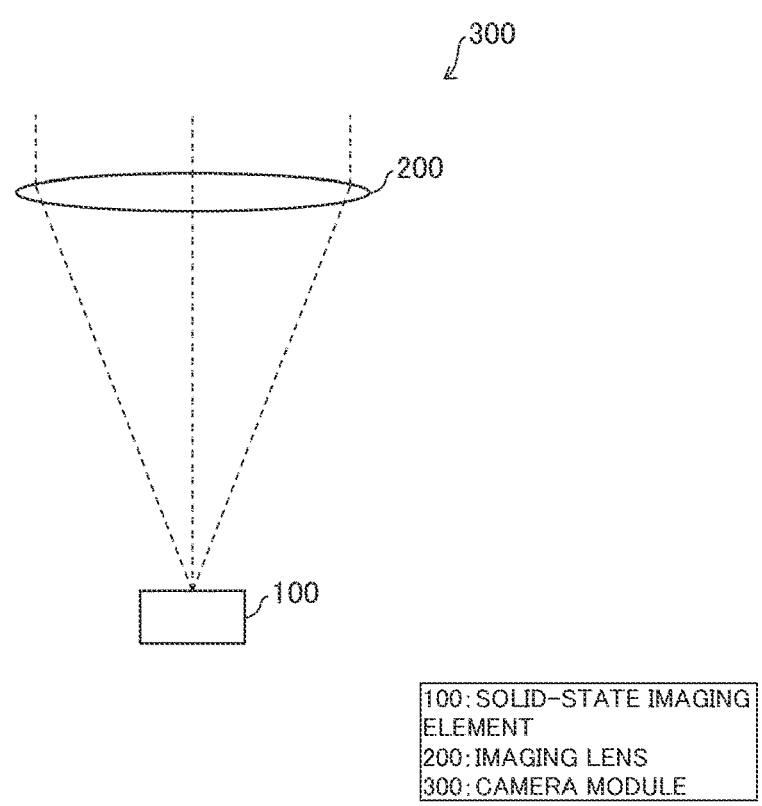
FIG. 2 is a schematic diagram of a camera module including the solid-state imaging element in FIG. 1.

FIG. 1 is a block diagram illustrating a schematic configuration of a solid-state imaging element 100 according to a first embodiment of the present disclosure. FIG. 2 is a schematic diagram of a camera module 300 including the solid-state imaging element 100.

The camera module 300 includes: the solid-state imaging element 100; and an imaging lens 200 that concentrates light onto the solid-state imaging element 100. The camera module is, for example, a surveillance camera module. For surveillance camera modules, sensitivity is important. The sensitivity is an index of output with respect to brightness of a place where an image is obtained. In other words, the sensitivity is an index of clarity of an image obtained in a dark place.

The solid-state imaging element 100 includes: a pixel unit 1 that receives light passing through the imaging lens 200; and an image processing unit 2. The image processing unit 2 generates luminance signals and chrominance signals using output signals from the pixel unit 1, and synthesizes the luminance signals and the chrominance signals to obtain an image. A component other than the image processing unit 2 may be used to synthesize the luminance signals and the chrominance signals to obtain the image. The output signals from the pixel unit 1 are video signals. More specifically, the output signals are video signals corresponding to RAW data.

The pixel unit 1 includes a first pixel group 3 and a second pixel group 4. The first pixel group 3 includes a plurality of first pixels 5. The second pixel group 4 includes a plurality of second pixels 6. Specific examples of arrangements of the plurality of first pixels 5 and the plurality of second pixels 6 will be described later.

If the plurality of first pixels 5 and the plurality of second pixels 6 are arranged in a matrix, the solid-state imaging element 100 may include: a row selecting circuit that selects at least one row of the matrix; and a column selecting circuit that selects at least one column of the matrix. The solid-state imaging element 100 may include a constant-current source circuit that converts currents of the output signal from the pixel unit 1 into voltages. The solid-state imaging element 100 may include an analog-digital conversion circuit that converts analog signals, obtained from the output signals from the pixel unit 1, into digital signals, and that supplies the obtained digital signals to the image processing unit 2.

The solid-state imaging element 100 generates chrominance signals, using output signals from the plurality of first pixels 5. Each of the plurality of first pixels 5 has a peak of a spectral response characteristic preferably in, but not limited to, primary colors (e.g., three primary colors of light and three primary colors of coloring materials). Alternatively, the peak may be found in, for example, a complementary color of the primary colors. The output signals from the plurality of first pixels 5 are included in output signals from the pixel unit 1 and associated with the plurality of first pixels 5.

In the embodiments of the present disclosure, each of the plurality of first pixels 5 has a peak of a spectral response characteristic in the three primary colors of light. In other words, each of the plurality of first pixels 5 is any one of a red pixel, a green pixel, or a blue pixel. The red pixel is a first pixel 5 having a peak of a spectral response characteristic in red. The green pixel is a first pixel 5 having a peak of a spectral response characteristic in green. The blue pixel is a first pixel 5 having a spectral response characteristic in blue.

Each of the plurality of second pixels 6 has a spectral response characteristic in white. When the spectral response characteristic is found in white, it means that the second pixels 6 have a spectral response for which there is no color filter to shield a specific wavelength all across, or almost all across, the visible light range (a wavelength of 360 nm or more and 700 nm or less).

In order for the second pixels 6 to have the spectral response characteristic in white, the second pixels 6 may have a filter whose passband is all across, or almost all across, the visible light range. Alternatively, the second pixels 6 may omit such a filter.

The solid-state imaging element 100 generates luminance signals, using the output signals from the plurality of second pixels 6, without using the output signals from the plurality of first pixels 5. The output signals from the plurality of second pixels 6 are included in the output signals from the pixel unit 1 and associated with the plurality of second pixels 6.

Figure 3:
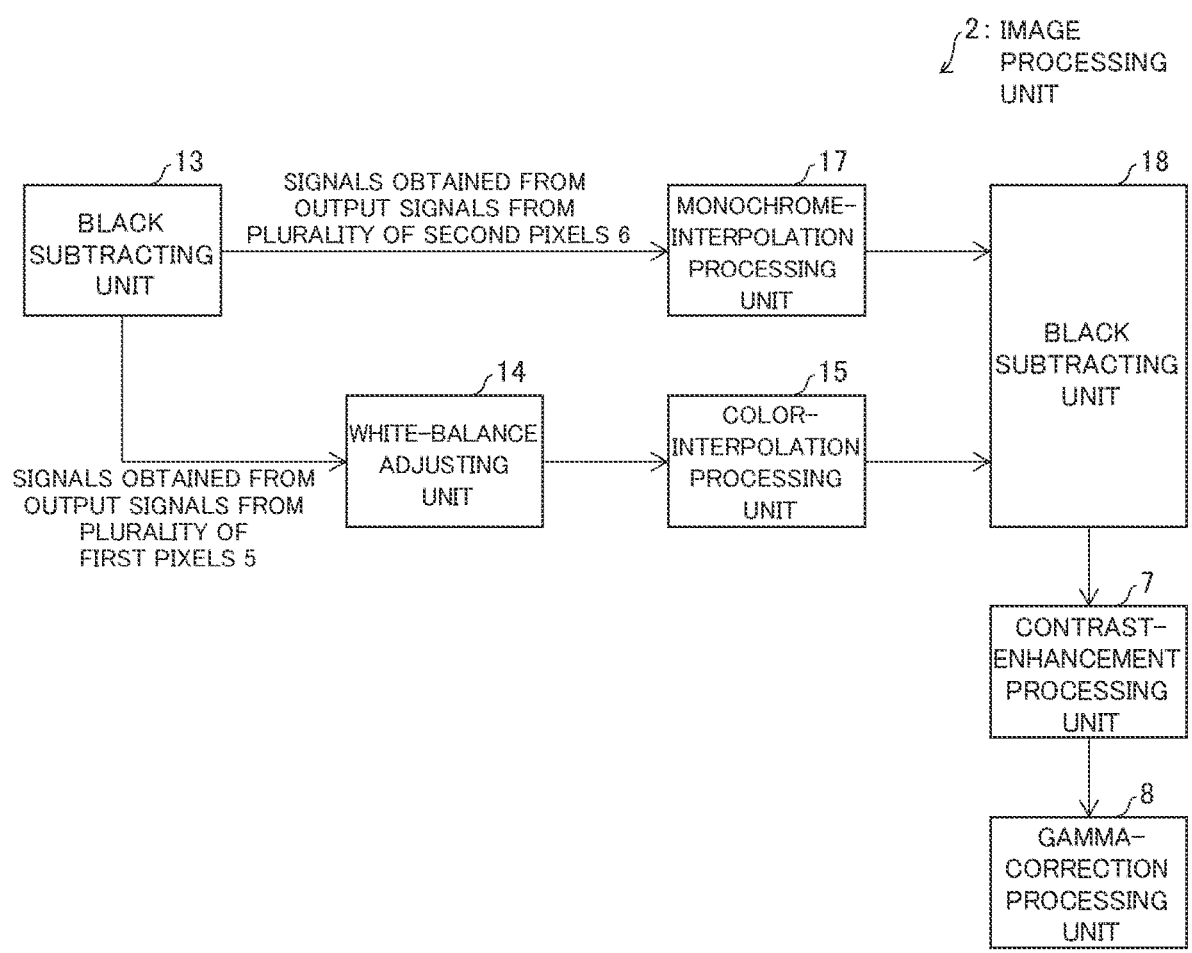
FIG. 3 is a block diagram illustrating a schematic configuration of an image processing unit of the solid-state imaging element in FIG. 1.

FIG. 3 is a block diagram illustrating a schematic configuration of the image processing unit 2. The image processing unit 2 includes: a black subtracting unit 13; a white-balance adjusting unit 14; a color-interpolation processing unit 15; a monochrome-interpolation processing unit 17; a synthesis unit 18; a contrast-enhancement processing unit 7; and a gamma-correction processing unit 8.

The black subtracting unit 13 performs black subtraction processing (also referred to as dark subtraction processing) on signals obtained from the output signals from the pixel unit 1.

The white-balance adjusting unit 14 performs white-balance adjustment processing on signals included in output signals from the black subtracting unit 13 and obtained from the output signals from the plurality of the first pixels 5. The white-balance adjusting unit 14 omits the white-balance adjustment processing on signals included in the output signals from the black subtracting unit 13 and obtained from the output signals from the plurality of the second pixels 6.

The white-balance adjusting unit 14 adjusts, as the white-balance adjustment processing, a level of a signal associated with a red pixel and a level of a signal associated with a blue pixel, with reference to a level of a signal associated with a green pixel. Such a feature makes it possible to appropriately present white on an image to be obtained by the solid-state imaging element 100.

The color-interpolation processing unit 15 performs interpolation processing on output signals from the white-balance adjusting unit 14, in accordance with the three primary colors of light. Output signals from the color-interpolation processing unit 15 correspond to the chrominance signals. The output signals from the color-interpolation processing unit 15 may be represented by either the RGB color system, or by the UV coordinate system.

The monochrome-interpolation processing unit 17 performs monochrome-interpolation processing on the signals included in the output signals from the black subtracting unit 13 and obtained from the output signals from the plurality of the second pixels 6. The monochrome-interpolation processing unit 17 omits the monochrome-interpolation processing on the signals included in the output signals from the black subtracting unit 13 and obtained from the output signals from the plurality of the first pixels 5.

The monochrome-interpolation processing unit 17 performs the processing based on a so-called adaptive processing correction technique. The adaptive processing correction technique involves discriminating a vertical line and a horizontal line from a pattern of vertical and horizontal lines, and weighing information obtained from a surrounding pixel. If the plurality of first pixels 5 and the plurality of second pixels 6 are arranged in a diagonal lattice, the monochrome-interpolation processing unit 17 may perform the interpolation processing for a diagonal-lattice arrangement and then for a square-lattice arrangement. Output signals from the monochrome-interpolation processing unit 17 correspond to the luminance signals. These luminance signals are monochrome signals.

The synthesis unit 18 synthesizes the luminance signals (the output signals from the monochrome-interpolation processing unit 17) and the chrominance signals (the output signals from the color-interpolation processing unit 15) to form an image to be generated by the solid-state imaging element 100. The synthesis unit 18 maps color information represented by the chrominance signals onto luminance information represented by the luminance signals, to form the image to be generated by the solid-state imaging element 100.

The contrast-enhancement processing unit 7 performs contrast-enhancement processing on output signals from the synthesis unit 18. The gamma-correction processing unit 8 performs gamma-correction processing on output signals from the contrast-enhancement processing unit 7.

The image processing unit 2 may have a color matrix (not shown) for color matrix processing to be performed on the output signals from the color-interpolation processing unit 15, or on synthesized signals generated of the luminance signals and the chrominance signals mapped on the luminance signals by the synthesis unit 18. The color matrix provides processing to input signals to determine contrasting density of a color of, and/or a hue of, an image to be presented by the solid-state imaging element 100. A trade-off is observed between the color reproducibility and the amount of color noise.

The solid-state imaging element 100 generates the luminance signals, without using the output signals from the plurality of first pixels 5 whose spectral response characteristics are different between the red pixels, the green pixels, and the blue pixels. Thanks to such a feature, the conventional solid-state imaging element 100 can reduce the risk that jaggies could appear on the periphery of the image because of chromatic aberration of the imaging lens 200. As a result, the solid-state imaging element 100 is high in resolution.

The human eye is sensitive to resolution of luminance defined by a luminance signal; whereas, the human eye is insensitive to resolution of color defined by a chrominance signal. Taken into such characteristics of the human eye into consideration, the low resolution in color is more acceptable than the low resolution in luminance. The solid-state imaging element 100 increases the resolution of luminance in exchange for the resolution of color to enhance sensitivity of the solid-state imaging 100.

If the luminance signals are monochrome signals, different techniques might be applied between white-balance adjustment processing for the color chrominance signals (color signals) and white-balance adjustment processing for the luminance signals. In such a case, a configuration to execute the white-balance adjustment processing could be complex. Whereas, the white-balance adjusting unit 14 can be formed of a simple configuration because the white-balance adjustment processing for the chrominance signals will suffice.

Second Embodiment

Figure 4:
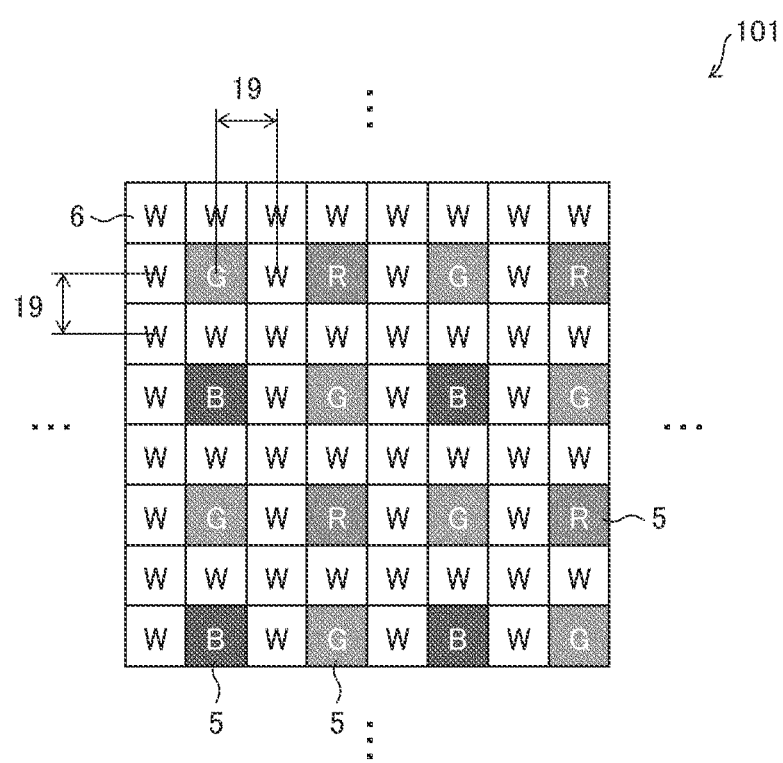
FIG. 4 is a plan view illustrating an arrangement of a plurality of first pixels and a plurality of second pixels according to the second embodiment of the present disclosure.

FIG. 1 is a block diagram illustrating a schematic configuration of the solid-state imaging element 100 according to a second embodiment of the present disclosure. FIG. 4 is a plan view illustrating an arrangement of the plurality of first pixels and the plurality of second pixels according to the second embodiment of the present disclosure. Hereinafter, this arrangement is referred to as a pixel arrangement 101.

In the pixel arrangement 101, each of the first pixels 5 is represented by R, G, or B. Specifically, in the pixel arrangement 101, each red pixel is represented by R, each green pixel is represented by G, and each blue pixel is represented by B. In the pixel arrangement 101, each of the second pixels 6 is represented by W.

Each of the plurality of first pixels 5 is square. Each of the plurality of second pixels 6 is square. In the pixel arrangement 101, the plurality of first pixels 5 and the plurality of second pixels 6 are arranged in a matrix. In the pixel arrangement 101, the plurality of first pixels 5 and the plurality of second pixels 6 are arranged in a square lattice. A pixel pitch in the pixel arrangement 101 is represented by a pixel pitch 19 in FIG. 4. The term pixel is a generic term of one of the plurality of first pixels 5 and one of the plurality of the second pixels 6.

In the row and column directions of the square-lattice arrangement in the pixel arrangement 101, one of the plurality of second pixels 6 is disposed between neighboring two of the plurality of first pixels 5.

In the pixel arrangement 101, the second pixels 6 are significantly larger in pixel count than the first pixels 5. In the pixel arrangement 101, the ratio of the pixel count of the red pixels to the pixel count of the green pixels to the pixel count of the green pixels among the plurality of first pixels 5 is, for example, 1 to 2 to 1.

Third Embodiment

Figure 5:
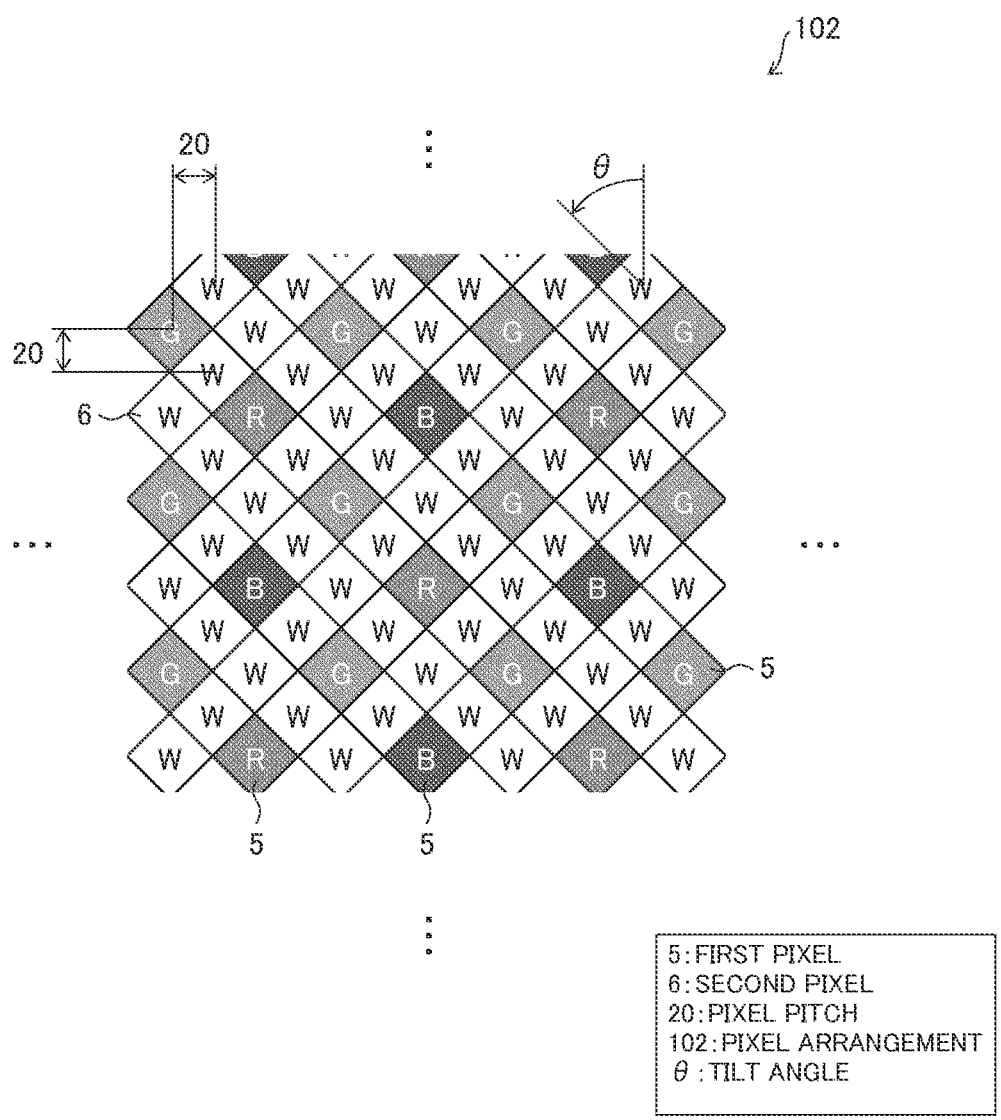
FIG. 5 is a plan view illustrating an arrangement of the plurality of first pixels and the plurality of second pixels according to the third embodiment of the present disclosure.

FIG. 1 is a block diagram illustrating a schematic configuration of the solid-state imaging element 100 according to a third embodiment of the present disclosure. FIG. 5 is a plan view illustrating an arrangement of the plurality of first pixels 5 and the plurality of second pixels 6 according to the third embodiment of the present disclosure. Hereinafter, this arrangement is referred to as a pixel arrangement 102. The pixel arrangement 102 and the pixel arrangement 101 are different in the points below. Otherwise, the pixel arrangement 102 and the pixel arrangement 101 are the same.

In the pixel arrangement 102, the plurality of first pixels 5 and the plurality of second pixels 6 are arranged in a diagonal lattice. The pixels in the pixel arrangement 102 are tilted with respect to the pixels in the pixel arrangement 101 at an angle of, for example, but not limited to, 45°.

A pixel pitch in the pixel arrangement 102 is represented by a pixel pitch 20 in FIG. 5. If the tilt angle $\theta$ is 45° and the pixel pitch 20 is the same as the pixel pitch 19, a size of the pixels in the pixel arrangement 102 is up to √2 times as large as a size of the pixels in the pixel arrangement 101. That is, compared with the pixel arrangement 101 (the square-lattice arrangement), the pixel arrangement 102 (the diagonal-lattice arrangement) can increase a physical pixel size (reduce the pixel count) while maintaining the "pixel pitch" of an image to be output, thereby successfully enhancing sensitivity of the solid-state imaging 100.

In the diagonal-lattice arrangement of the pixel arrangement 102, one of the plurality of second pixels 6 is disposed between neighboring two of the plurality of first pixels 5. Note that this condition "one of the plurality of second pixels 6" meets on the premise that the one second pixel 6 belongs to the same row (or to the same column) that the neighboring two of the plurality of first pixels 5 belong to.

In the pixel arrangement 102, the second pixels 6 are significantly larger in pixel count than the first pixels 5.

Figure 6:
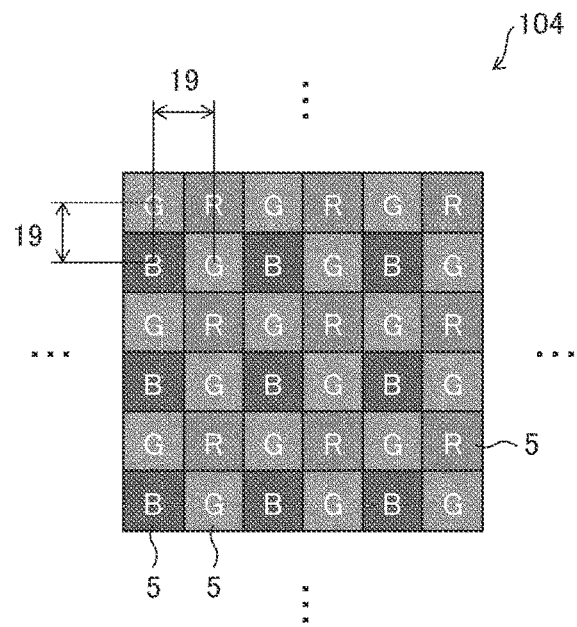
FIG. 6 shows plan views illustrating an arrangement of the plurality of first pixels according to a first comparative example and an arrangement of the plurality of first pixels according to a second comparative example.
Figure 6:
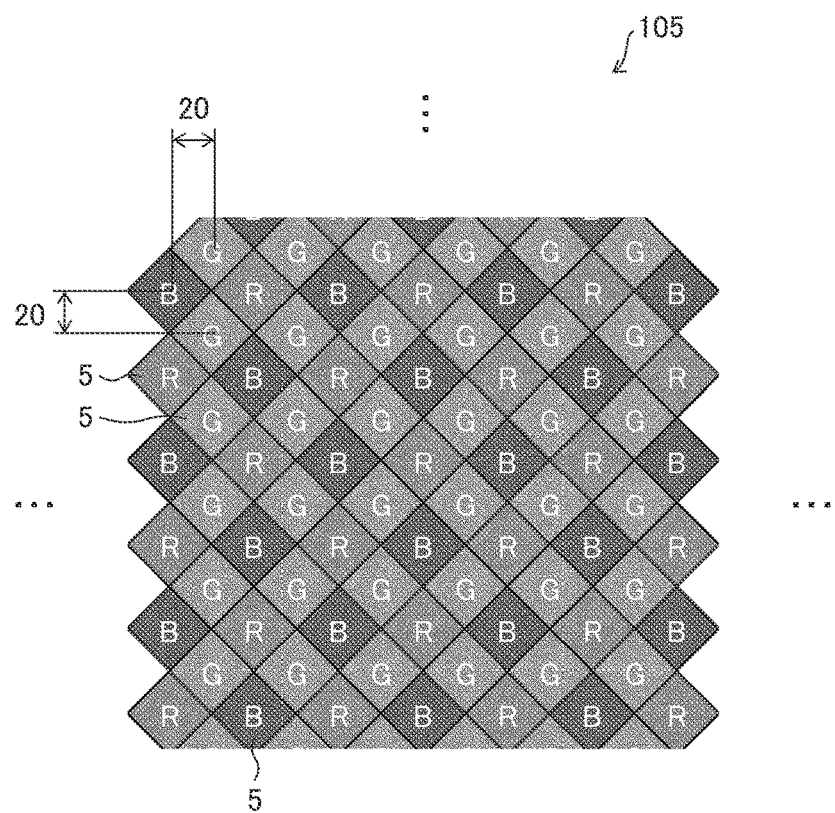

FIG. 6 shows plan views illustrating an arrangement of the plurality of first pixels 5 according to a first comparative example and an arrangement of the plurality of first pixels 5 according to a second comparative example. Hereinafter, the arrangement of the plurality of first pixels 5 according to the first comparative example is referred to as a pixel arrangement 104, and the arrangement of the plurality of first pixels 5 according to the second comparative example is referred to as a pixel arrangement 105.

In the pixel arrangement 104, each of the first pixels 5 is represented by R, G, or B. Specifically, in the pixel arrangement 104, each red pixel is represented by R, each green pixel is represented by G, and each blue pixel is represented by B.

Each of the plurality of first pixels 5 is square. In the pixel arrangement 104, the plurality of first pixels 5 are arranged in a matrix. In the pixel arrangement 104, the plurality of first pixels 5 are arranged in a square lattice. A pixel pitch in the pixel arrangement 104 is represented by a pixel pitch 19 in FIG. 6.

The pixel arrangement 105 is different from the pixel arrangement 104 in that the plurality of first pixels 5 in the pixel arrangement 105 are arranged in a diagonal lattice. Otherwise, the pixel arrangement 105 and the pixel arrangement 104 are the same. A pixel pitch in the pixel arrangement 105 is represented by a pixel pitch 20 in FIG. 6.

Figures 7, 8:
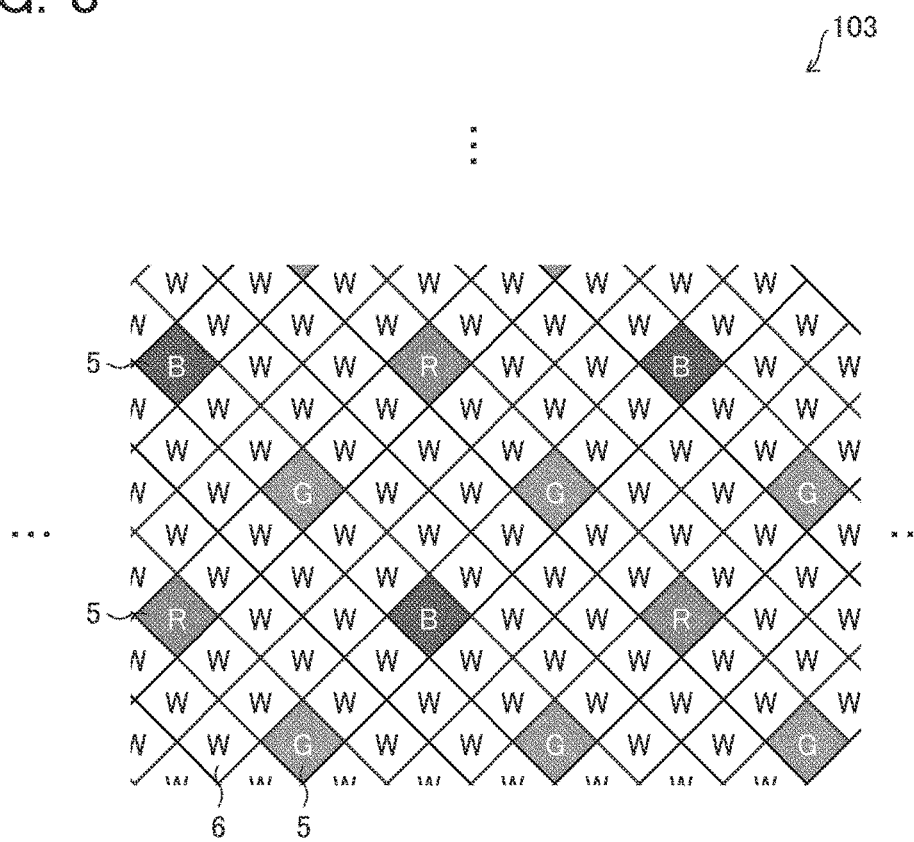
FIG. 7 is a table comparing a configuration according to the third embodiment of the present disclosure with configurations according to the comparative examples.
FIG. 8 is a plan view illustrating an arrangement of the plurality of first pixels and the plurality of second pixels according to the fourth embodiment of the present disclosure.

FIG. 7 is a table comparing the pixel arrangements 104, 105, and 102. FIG. 7 shows that, if the solid-state imaging element 100 associated with the pixel arrangement 104 has a sensitivity of S, the solid-state imaging element 100 associated with the pixel arrangement 105 has a sensitivity of 2S and the solid-state imaging element 100 associated with the pixel arrangement 102 has a sensitivity of 3S. If the arrangement of the plurality of first pixels 5 is changed from the square-lattice arrangement to the diagonal-lattice arrangement, the sensitivity of the solid-state imaging element 100 approximately doubles. Using the plurality of second pixels 6 in addition to the plurality of first pixels 5, the sensitivity of the solid-state imaging element 100 increases by approximately 1.5 times. This is because the plurality of second pixels 6 absorb sufficiently less amount of light than the plurality of first pixels 5 do.

Fourth Embodiment

FIG. 1 is a block diagram illustrating a schematic configuration of the solid-state imaging element 100 according to a fourth embodiment of the present disclosure. FIG. 8 is a plan view illustrating an arrangement of the plurality of first pixels 5 and the plurality of second pixels 6 according to the fourth embodiment of the present disclosure. Hereinafter, this arrangement is referred to as a pixel arrangement 103. The pixel arrangement 103 and the pixel arrangement 102 are different in the points below. Otherwise, the pixel arrangement 103 and the pixel arrangement 102 are the same.

In the diagonal-lattice arrangement of the pixel arrangement 103, two or more (two in FIG. 8) of the plurality of second pixels 6 are disposed between neighboring two of the plurality of first pixels 5. Note that this condition "two or more of the plurality of second pixels 6" meets on the premise that the two or more second pixels 6 belong to the same row (or to the same column) that the neighboring two of the plurality of first pixels 5 belong to.

In the pixel arrangement 103, the second pixels 6 are significantly larger in pixel count than the first pixels 5.

Fifth Embodiment

Figure 9:
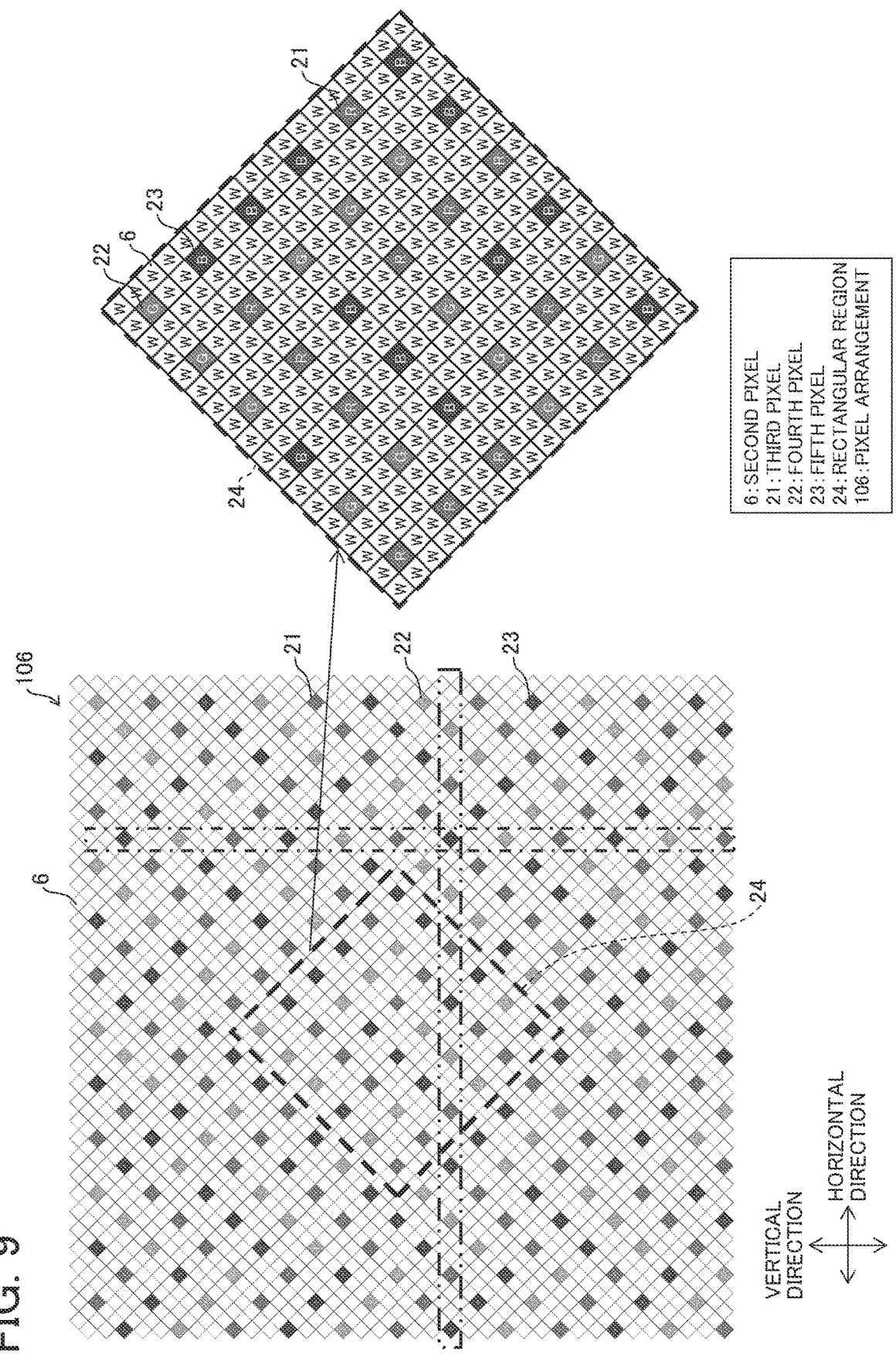
FIG. 9 is a plan view illustrating an arrangement of the plurality of first pixels and the plurality of second pixels according to the fifth embodiment of the present disclosure.

FIG. 1 is a block diagram illustrating a schematic configuration of the solid-state imaging element 100 according to a fifth embodiment of the present disclosure. FIG. 9 is a plan view illustrating an arrangement of the plurality of first pixels 5 and the plurality of second pixels 6 according to the fifth embodiment of the present disclosure. Hereinafter, this arrangement is referred to as a pixel arrangement 106. The pixel arrangement 106 and the pixel arrangement 103 are different in the points below.

In the pixel arrangement 106, the plurality of first pixels 5 include: a plurality of third pixels 21 having a peak of a spectral response characteristic in red (a first color); a plurality of fourth pixels 22 having a peak of a spectral response characteristic in green (a second color); and a plurality of fifth pixels 23 having a peak of a spectral response characteristic in blue (a third color). In the pixel arrangement 106, each third pixel 21 is represented by R, each fourth pixel 22 is represented by G, and each fifth pixel 23 is represented by B.

In the solid-state imaging element 100, the plurality of first pixels 5 and the plurality of the second pixels 6 are arranged in the pixel arrangement 106 having a rectangular region 24 including the third pixels 21, the fourth pixels 22, and the fifth pixels 23 in equal pixel counts. In the pixel arrangement 106, the rectangular region 24 includes, as an example, 12 third pixels 21, 12 fourth pixels 22, and 12 fifth pixels 23. The pixel count of the third pixels 21, the fourth pixels 22, and the fifth pixels 23 included in the rectangular region 24 shall not be limited to 12.

In both the vertical direction and the horizontal direction of the pixel arrangement 106, the third pixels 21, the fourth pixels 22, and the fifth pixels 23 are alternately arranged in the stated order. In a region of FIG. 9 surrounded by a dash-dot-dash line, the third pixels 21, the fourth pixels 22, and the fifth pixels 23 are alternately arranged in the stated order upwards in the vertical direction. In a region of FIG. 9 surrounded by a dash-dot-dot-dash line, the third pixels 21, the fourth pixels 22, and the fifth pixels 23 are alternately arranged in the stated order from left to right in the horizontal direction. In the vertical direction and/or the horizontal direction, the third pixels 21, the fourth pixels 22, and the fifth pixels 23 do not have to be arranged alternately in the stated order. Moreover, in this pixel arrangement 106, the order of the alternate arrangement of the third pixels 21, the fourth pixels 22, and the fifth pixels 23 in the vertical direction and/or the horizontal direction may be different, depending on the region.

The pixel arrangement 106 can reduce unbalanced distribution of the plurality of third pixels 21, the plurality of fourth pixels 22, and the plurality of fifth pixels 23. Hence, the pixel arrangement 106 can reduce a decrease in the resolution of the solid-state imaging element 100 caused by the processing on the image processing unit 2, and can also reduce appearance of false color from the solid-state imaging element 100.

Sixth Embodiment

Figure 10:
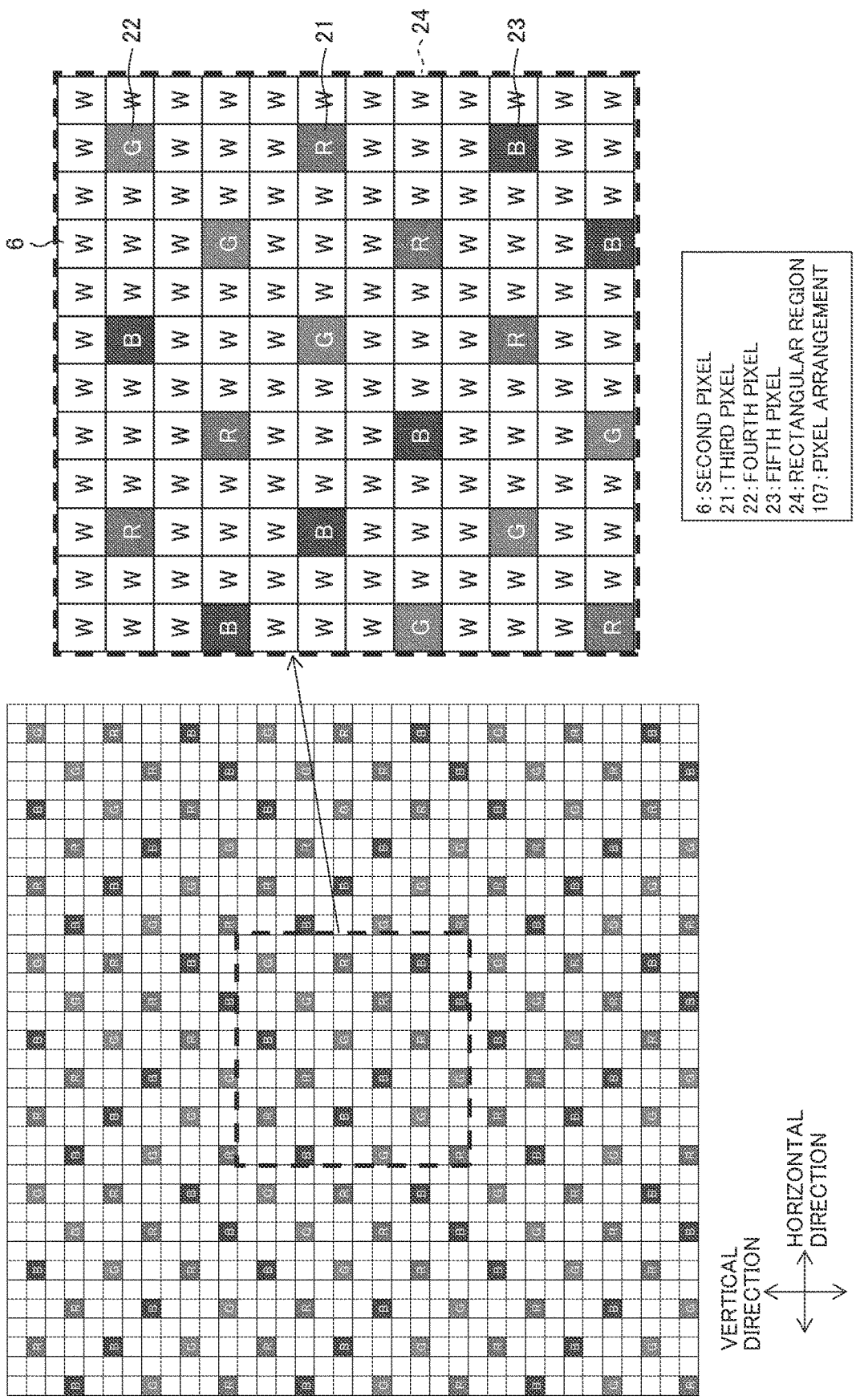
FIG. 10 is a plan view illustrating an arrangement of the plurality of first pixels and the plurality of second pixels according to the sixth embodiment of the present disclosure.

FIG. 1 is a block diagram illustrating a schematic configuration of the solid-state imaging element 100 according to a sixth embodiment of the present disclosure. FIG. 10 is a plan view illustrating an arrangement of the plurality of first pixels 5 and the plurality of second pixels 6 according to the sixth embodiment of the present disclosure. Hereinafter, this arrangement is referred to as a pixel arrangement 107. The pixel arrangement 107 is different from the pixel arrangement 106 in that, in the pixel arrangement 107, the plurality of first pixels 5 and the plurality of second pixels 6 are arranged in a square lattice. In the pixel arrangement 107, the rectangular region 24 includes, as an example, 6 third pixels 21, 6 fourth pixels 22, and 6 fifth pixels 23.

Seventh Embodiment

Figure 11:
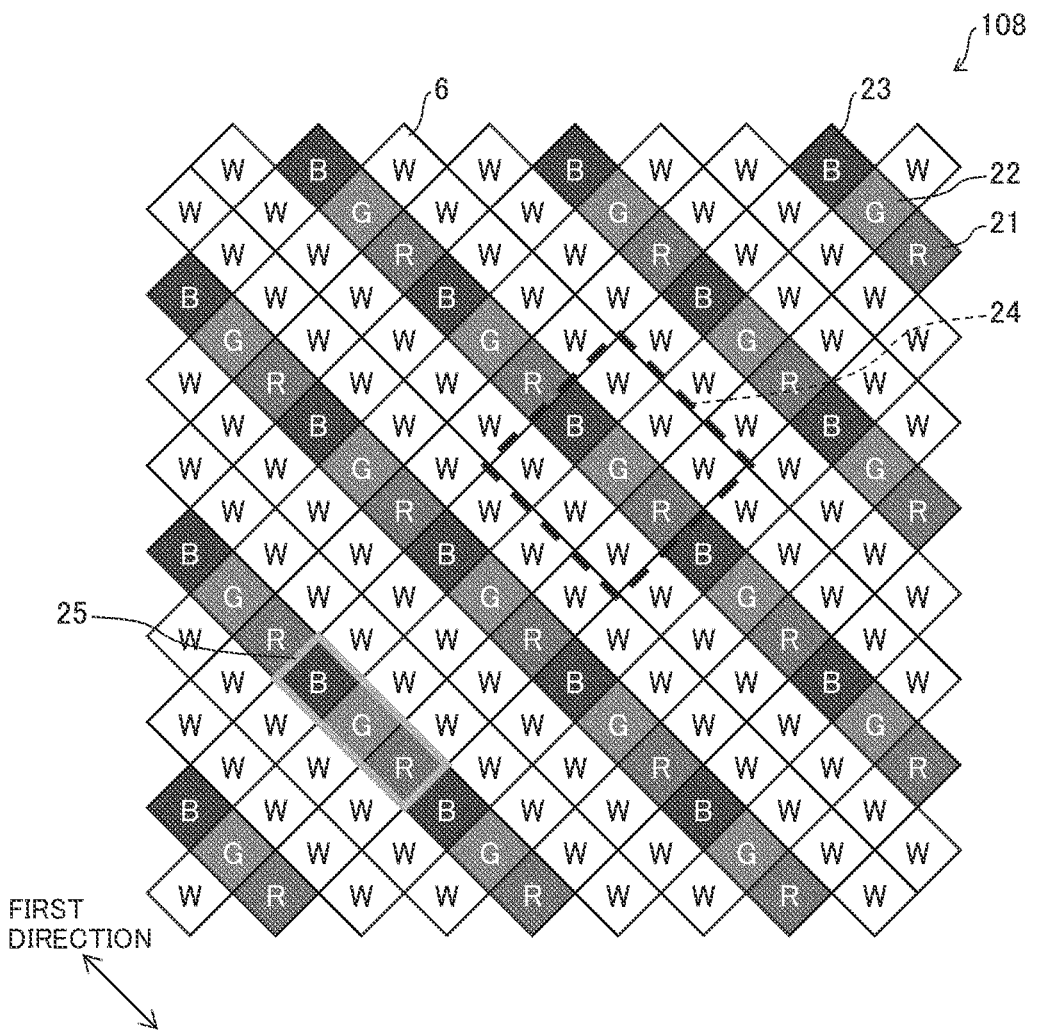
FIG. 11 is a plan view illustrating an arrangement of the plurality of first pixels and the plurality of second pixels according to the seventh embodiment of the present disclosure.
Figure 12:
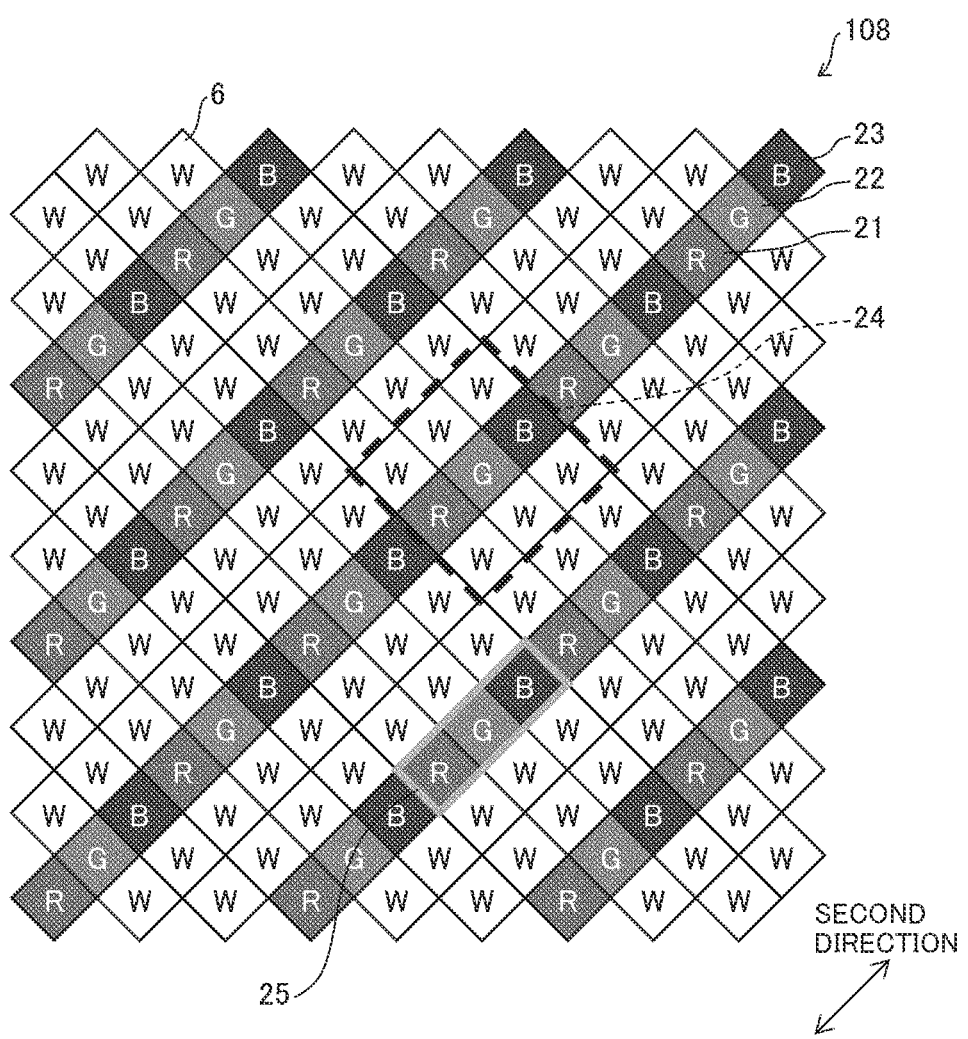
FIG. 12 is a plan view illustrating an arrangement of the plurality of first pixels and the plurality of second pixels according to the seventh embodiment of the present disclosure.

FIG. 1 is a block diagram illustrating a schematic configuration of the solid-state imaging element 100 according to a seventh embodiment of the present disclosure. Each of FIGS. 11 and 12 is a plan view illustrating an arrangement of the plurality of first pixels 5 and the plurality of second pixels 6 according to the seventh embodiment of the present disclosure. Hereinafter, this arrangement is referred to as a pixel arrangement 108. The pixel arrangement 108 and the pixel arrangement 106 are different in the points below.

The pixel arrangement 108 includes a plurality of pixel groups 25 arranged in a direction (a first direction in FIG. 11 and a second direction in FIG. 12) in which the plurality of first pixels 5 and the plurality of second pixels 6 are arranged. Each of the pixel groups 25 has a third pixel 21, a fourth pixel 22, and a fifth pixel 23 arranged in the stated order. In each of the pixel groups 25, none of the second pixels 6 is disposed between neighboring two of the third pixel 21, the fourth pixel 22, and the fifth pixel 23.

Thanks to the pixel arrangement 108, the third pixel 21, the fourth pixel 22, and the fifth pixel 23 are positioned as close as possible to one another so that a chromatic change is predicted in a simpler manner. Such a feature can reduce appearance of false color from the solid-state imaging element 100.

FIGS. 11 and 12 show the pixel arrangement 108 in two examples in total. In either example, the pixel arrangement 108 achieves the same advantageous effects.

In the vertical direction and/or the horizontal direction of the pixel arrangement 108, the third pixels 21, the fourth pixels 22, and the fifth pixels 23 do not have to be arranged alternately in the stated order.

Eighth Embodiment

Figure 13:
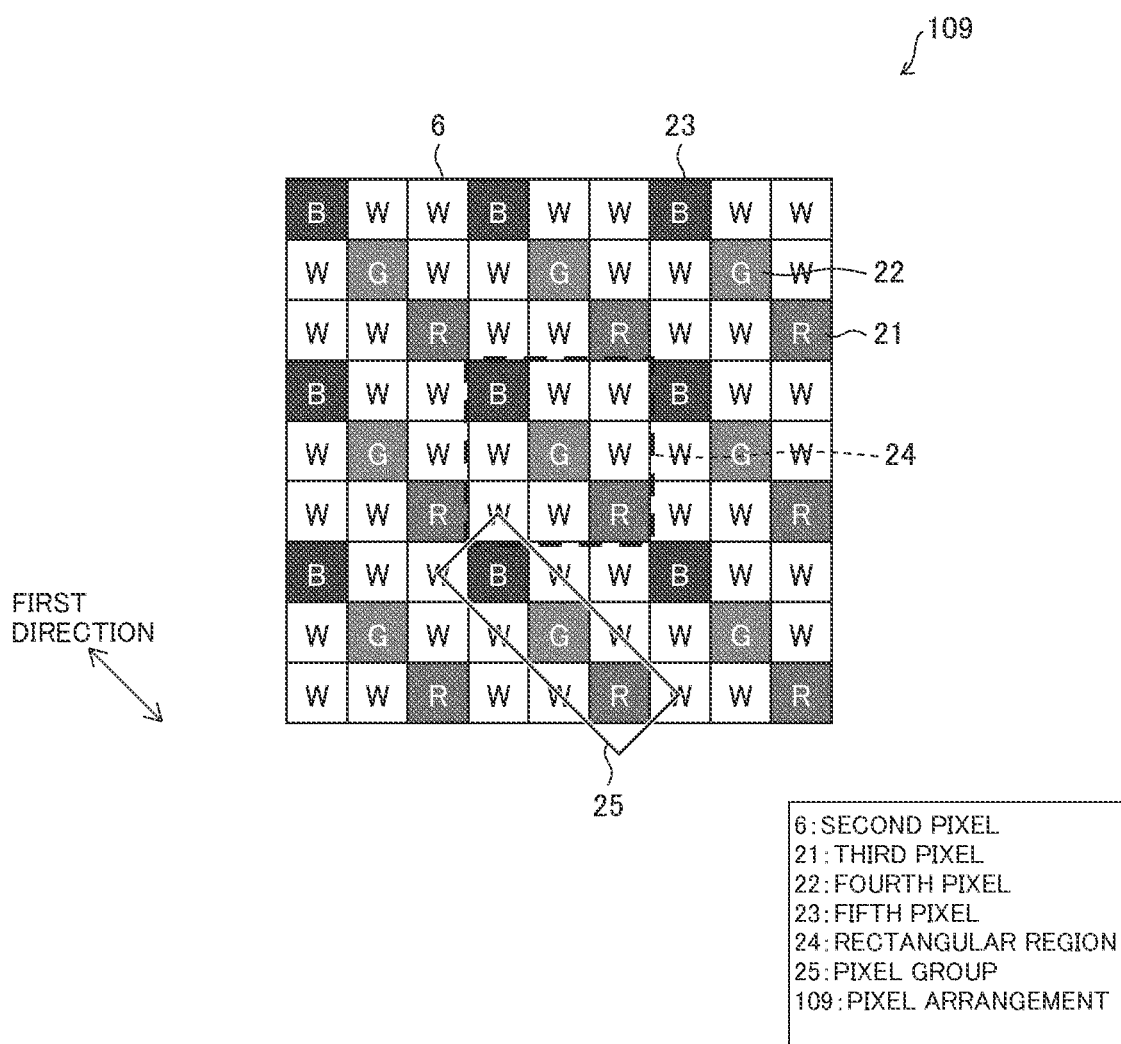
FIG. 13 is a plan view illustrating an arrangement of the plurality of first pixels and the plurality of second pixels according to the eighth embodiment of the present disclosure.
Figure 14:
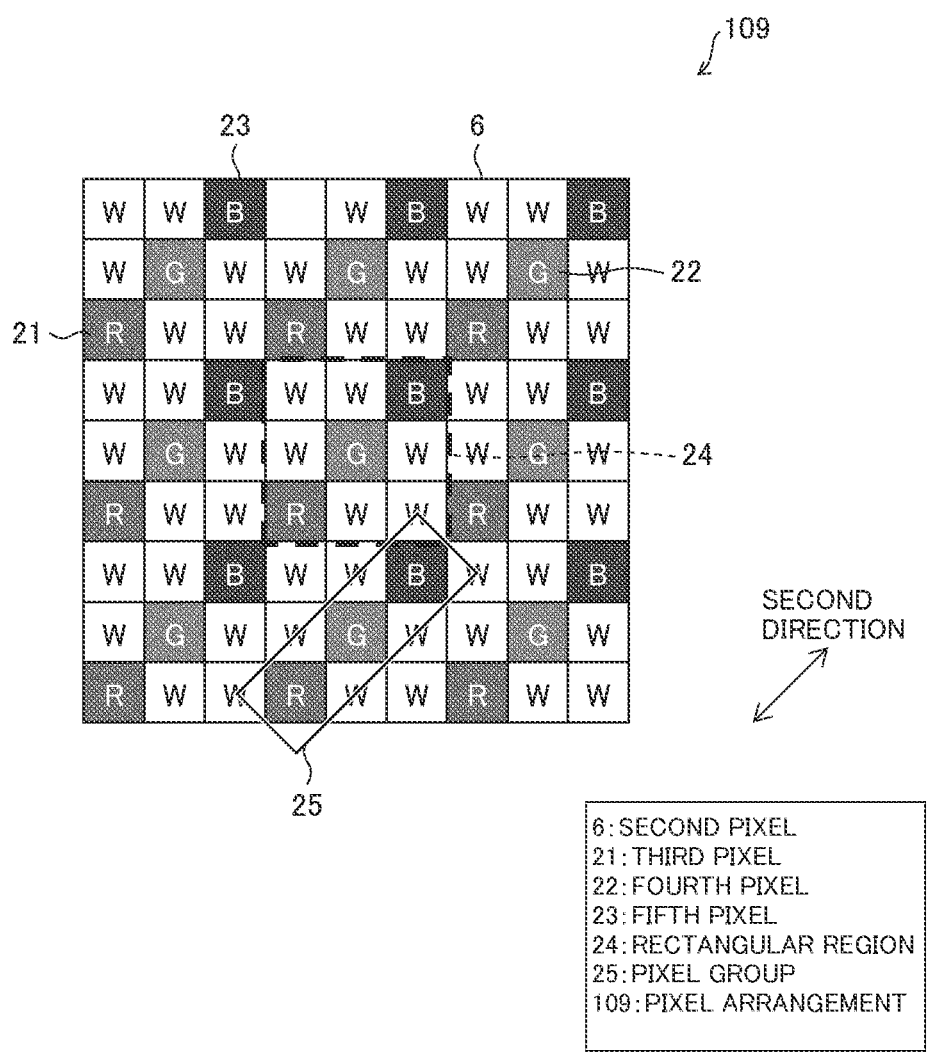
FIG. 14 is a plan view illustrating an arrangement of the plurality of first pixels and the plurality of second pixels according to the eighth embodiment of the present disclosure.

FIG. 1 is a block diagram illustrating a schematic configuration of the solid-state imaging element 100 according to an eighth embodiment of the present disclosure. Each of FIGS. 13 and 14 is a plan view illustrating an arrangement of the plurality of first pixels 5 and the plurality of second pixels 6 according to the eighth embodiment of the present disclosure. Hereinafter, this arrangement is referred to as a pixel arrangement 109. The pixel arrangement 109 is different from the pixel arrangement 108 in that, in the pixel arrangement 109, the plurality of first pixels 5 and the plurality of second pixels 6 are arranged in a square lattice.

FIGS. 13 and 14 show the pixel arrangement 109 in two examples in total. In either example, the pixel arrangement 109 achieves the same advantageous effects.

Ninth Embodiment

Figure 15:
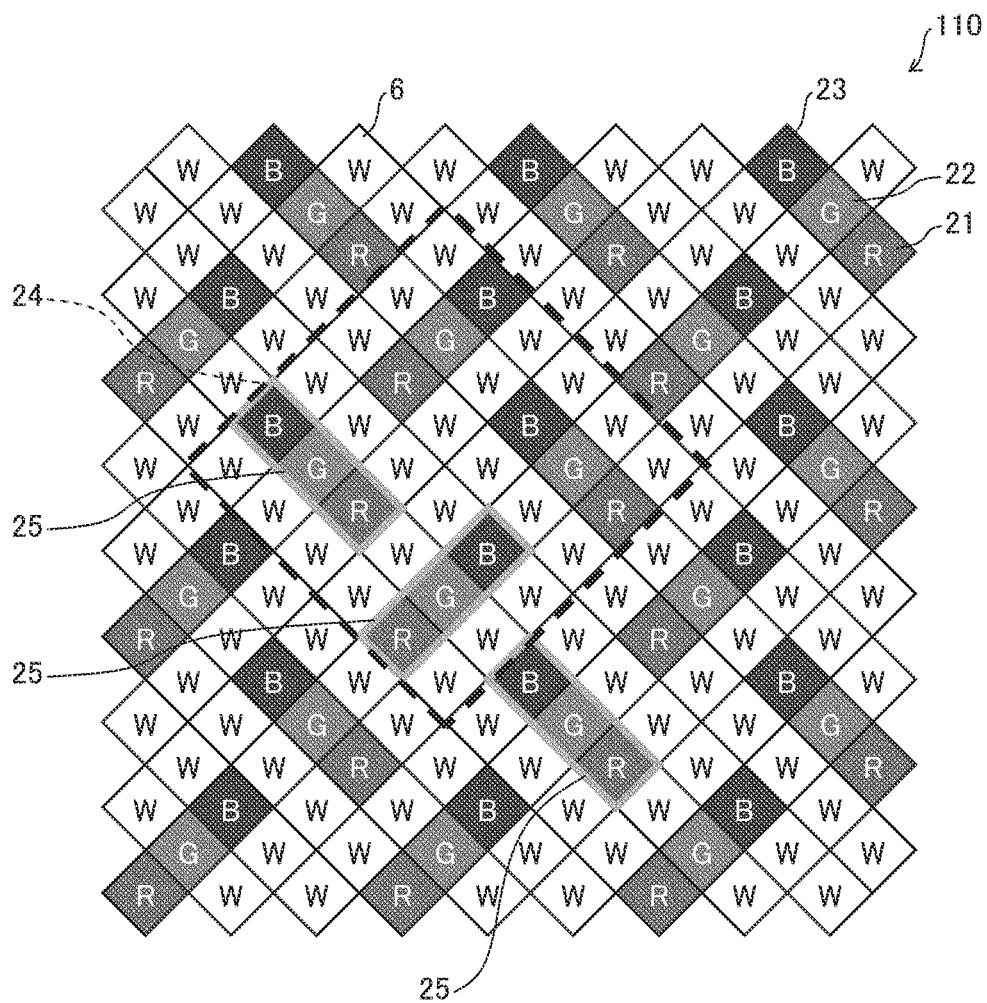
FIG. 15 is a plan view illustrating an arrangement of the plurality of first pixels and the plurality of second pixels according to the ninth embodiment of the present disclosure.
Figure 16:
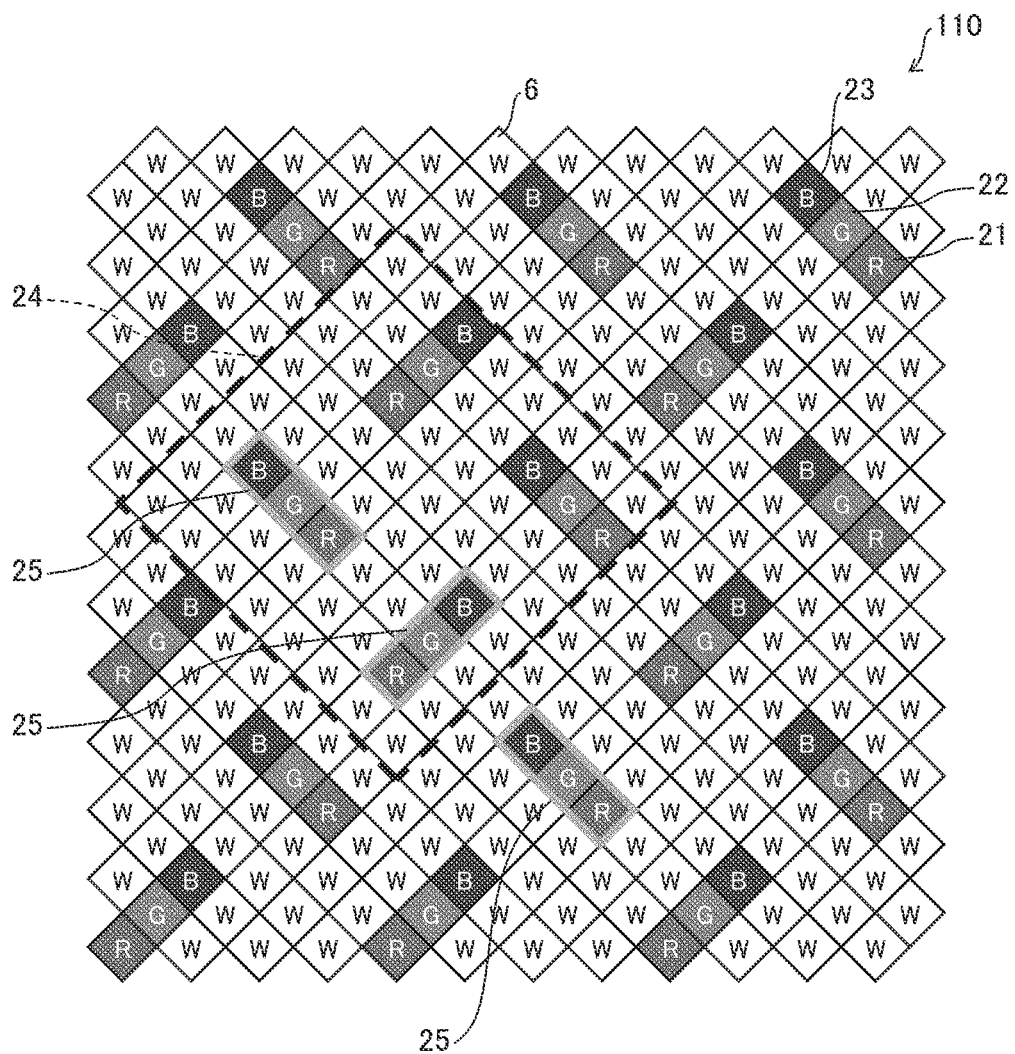
FIG. 16 is a plan view illustrating an arrangement of the plurality of first pixels and the plurality of second pixels according to the ninth embodiment of the present disclosure.
Figure 17:
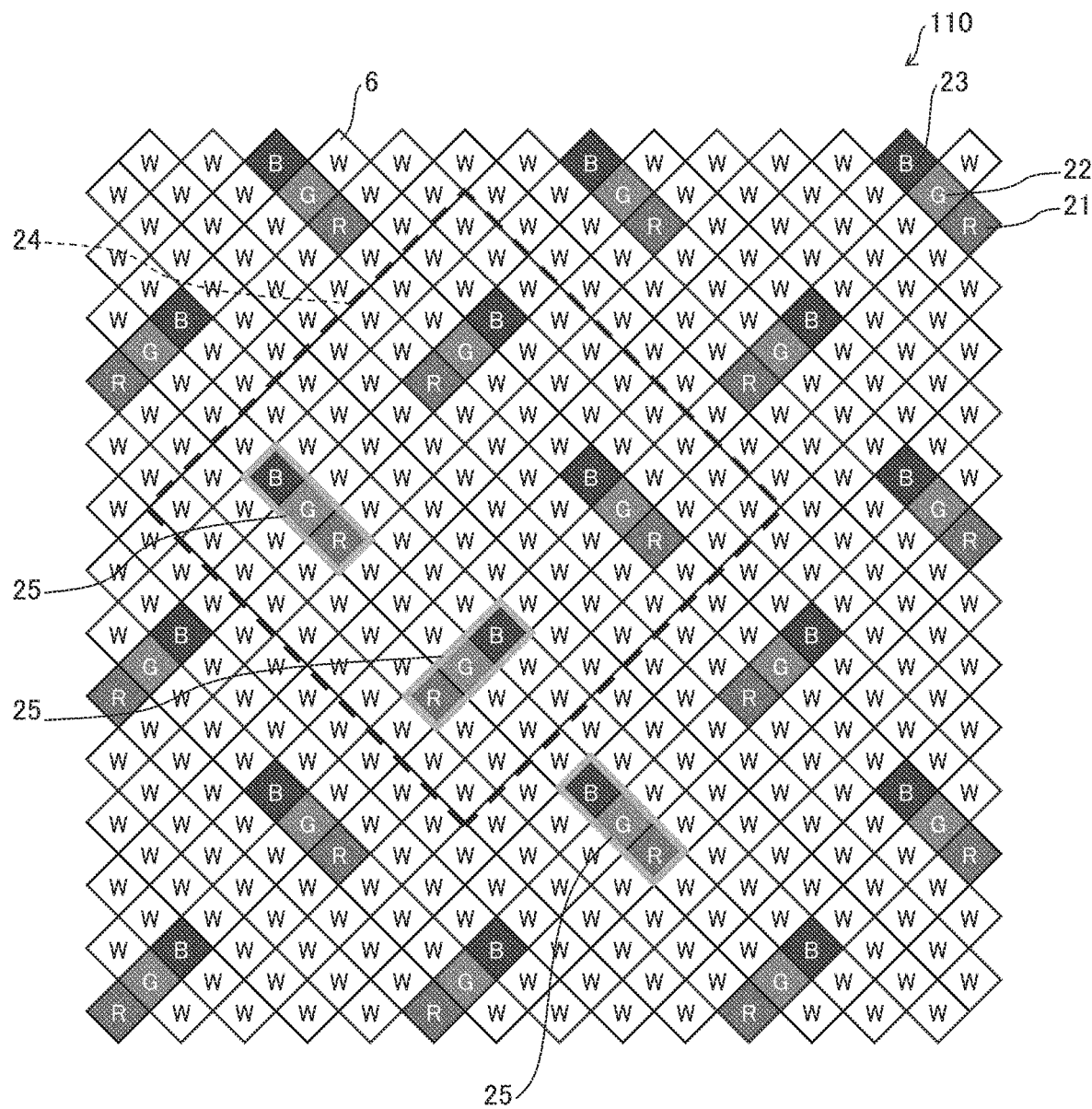
FIG. 17 is a plan view illustrating an arrangement of the plurality of first pixels and the plurality of second pixels according to the ninth embodiment of the present disclosure.

FIG. 1 is a block diagram illustrating a schematic configuration of the solid-state imaging element 100 according to a ninth embodiment of the present disclosure. Each of FIGS. 15 to 17 is a plan view illustrating an arrangement of the plurality of first pixels 5 and the plurality of second pixels 6 according to the ninth embodiment of the present disclosure. Hereinafter, this arrangement is referred to as a pixel arrangement 110. The pixel arrangement 110 and the pixel arrangement 108 are different in the points below.

Between neighboring two of the plurality of pixel groups 25, at least one of the plurality of second pixels 6 is disposed. Moreover, between two pixel groups 25 arranged in parallel with each other, another pixel group 25 is disposed orthogonally to the two pixel groups 25.

FIGS. 15 to 17 show the pixel arrangement 110 in three examples in total. FIG. 15 shows an example in which one of the plurality of second pixels 6 is disposed between neighboring two of the plurality of pixel groups 25. FIG. 16 shows an example in which two of the plurality of second pixels 6 are disposed between neighboring two of the plurality of pixel groups 25. FIG. 17 shows an example in which three of the plurality of second pixels 6 are disposed between neighboring two of the plurality of pixel groups 25.

Tenth Embodiment

Figure 18:
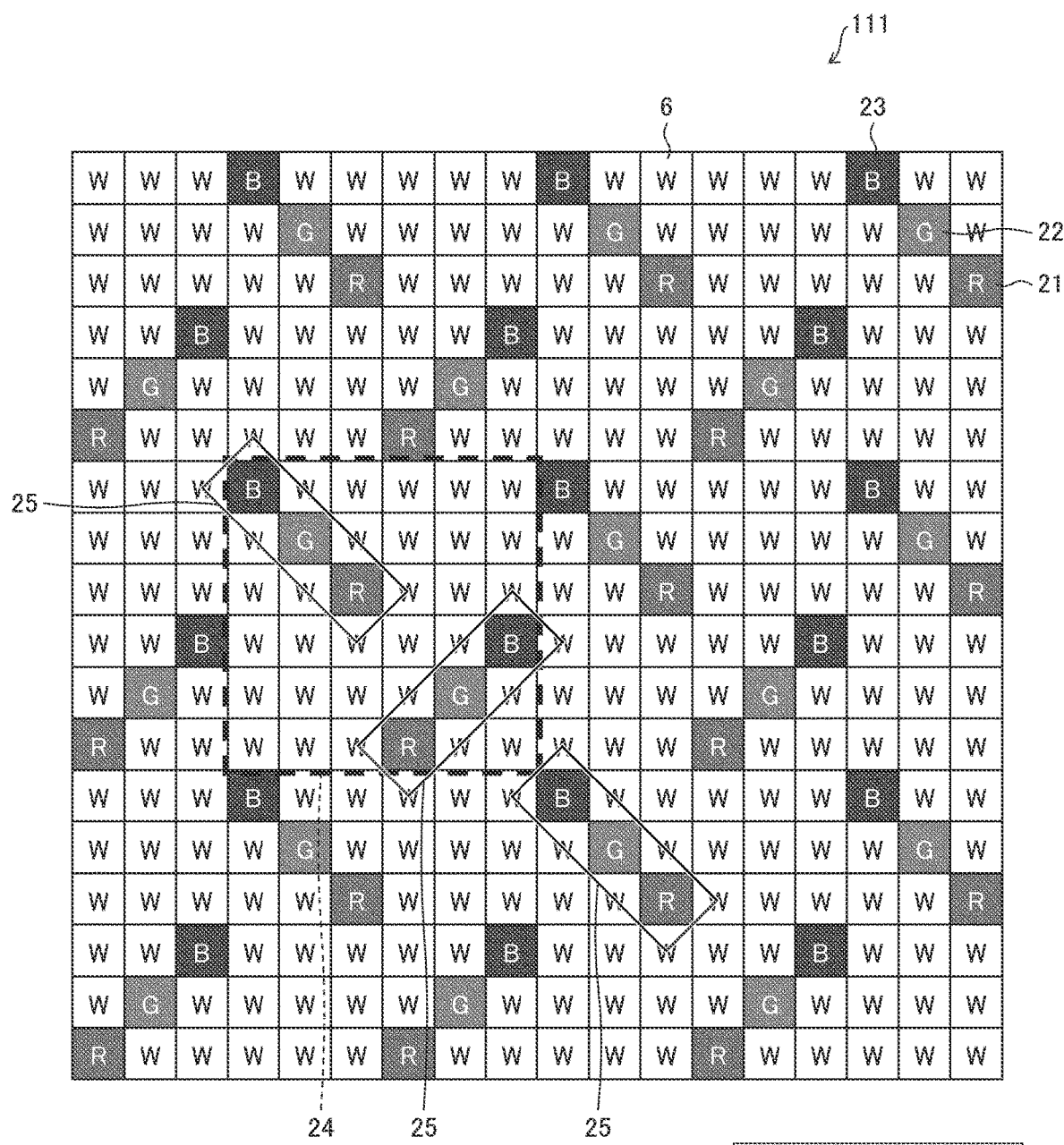
FIG. 18 is a plan view illustrating an arrangement of the plurality of first pixels and the plurality of second pixels according to the tenth embodiment of the present disclosure.

FIG. 1 is a block diagram illustrating a schematic configuration of the solid-state imaging element 100 according to a tenth embodiment of the present disclosure. FIG. 18 is a plan view illustrating an arrangement of the plurality of first pixels 5 and the plurality of second pixels 6 according to the tenth embodiment of the present disclosure. Hereinafter, this arrangement is referred to as a pixel arrangement 111. The pixel arrangement 111 is different from the pixel arrangement 110 in that, in the pixel arrangement 111, the plurality of first pixels 5 and the plurality of second pixels 6 are arranged in a square lattice.

Eleventh Embodiment

Figure 19:
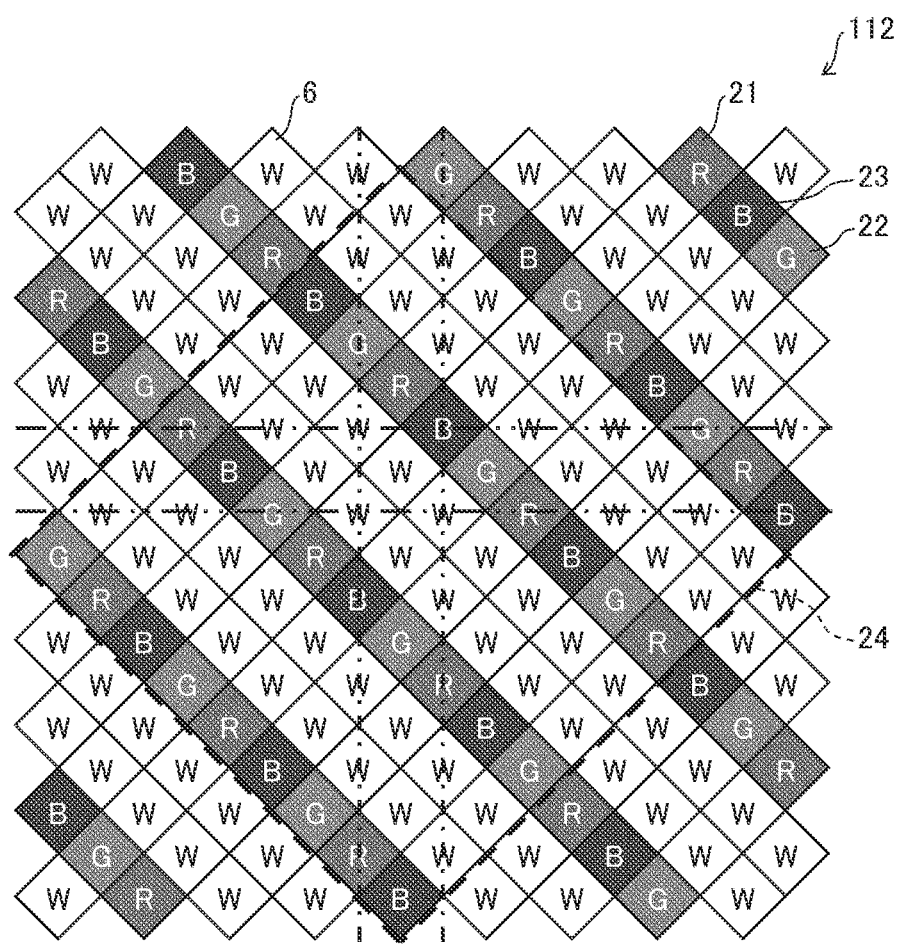
FIG. 19 is a plan view illustrating an arrangement of the plurality of first pixels and the plurality of second pixels according to the eleventh embodiment of the present disclosure.
Figure 20:
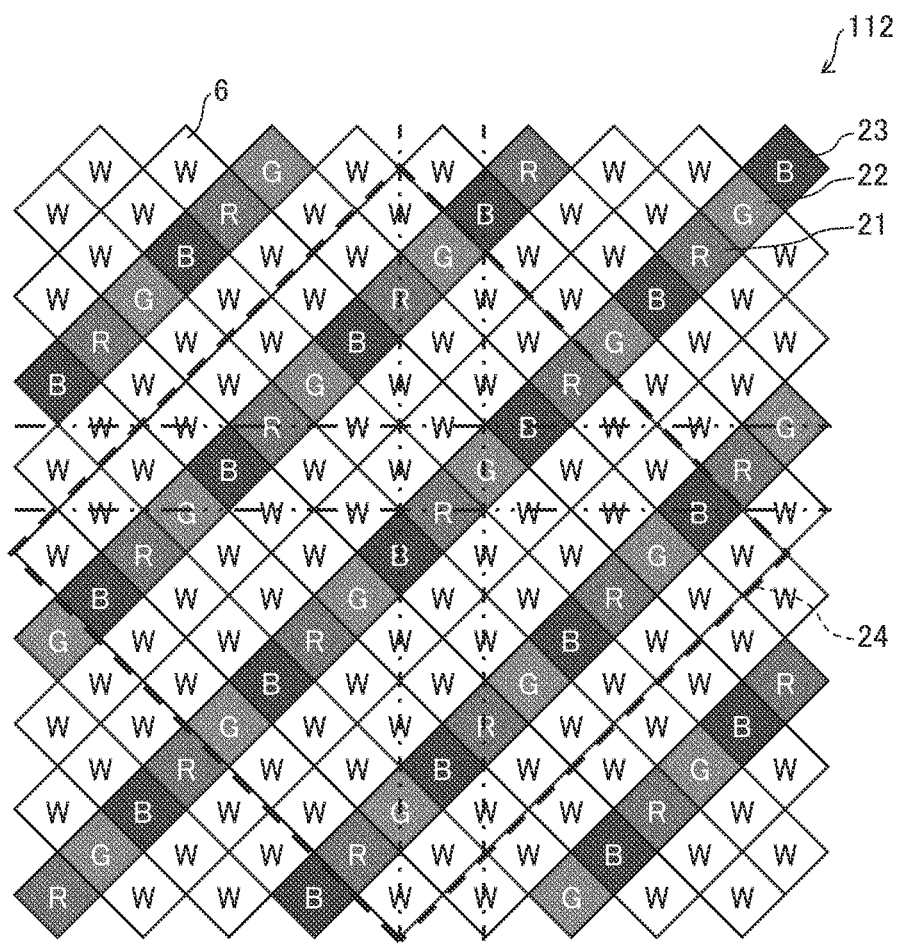
FIG. 20 is a plan view illustrating an arrangement of the plurality of first pixels and the plurality of second pixels according to the eleventh embodiment of the present disclosure.

FIG. 1 is a block diagram illustrating a schematic configuration of the solid-state imaging element 100 according to an eleventh embodiment of the present disclosure. Each of FIGS. 19 and 20 is a plan view illustrating an arrangement of the plurality of first pixels 5 and the plurality of second pixels 6 according to the eleventh embodiment of the present disclosure. Hereinafter, this arrangement is referred to as a pixel arrangement 112. The pixel arrangement 112 and the pixel arrangement 108 are different in the points below.

In the pixel arrangement 112, as seen in the pixel arrangement 106, the third pixels 21, the fourth pixels 22, and the fifth pixels 23 may be arranged alternately in the stated order in the vertical direction and the horizontal direction of the pixel arrangement 112. In a region of each of FIGS. 19 and 20 surrounded by a dash-dot-dash line, the third pixels 21, the fourth pixels 22, and the fifth pixels 23 are alternately arranged in the stated order upwards or downwards in the vertical direction. In a region of each of FIGS. 19 and 20 surrounded by a dash-dot-dot-dash line, the third pixels 21, the fourth pixels 22, and the fifth pixels 23 are alternately arranged in the stated order from left to right, or from right to left, in the horizontal direction. In the vertical direction and the horizontal direction, the third pixels 21, the fourth pixels 22, and the fifth pixels 23 do not have to be arranged alternately in the stated order.

FIGS. 19 and 20 show the pixel arrangement 112 in two examples in total. In either example, the pixel arrangement 112 achieves the same advantageous effects.

Twelfth Embodiment

Figure 21:
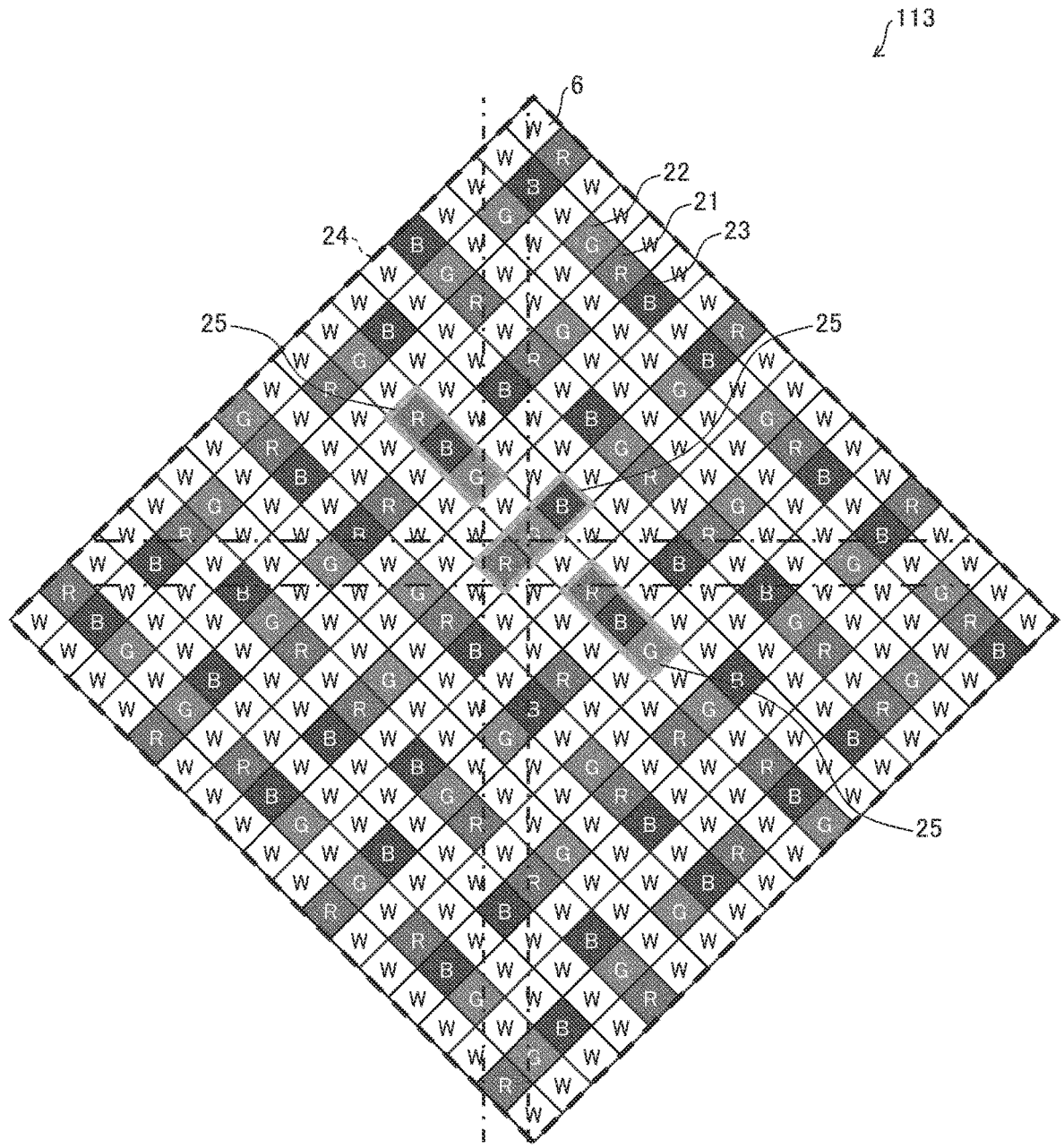
FIG. 21 is a plan view illustrating an arrangement of the plurality of first pixels and the plurality of second pixels according to the twelfth embodiment of the present disclosure.
Figure 22:
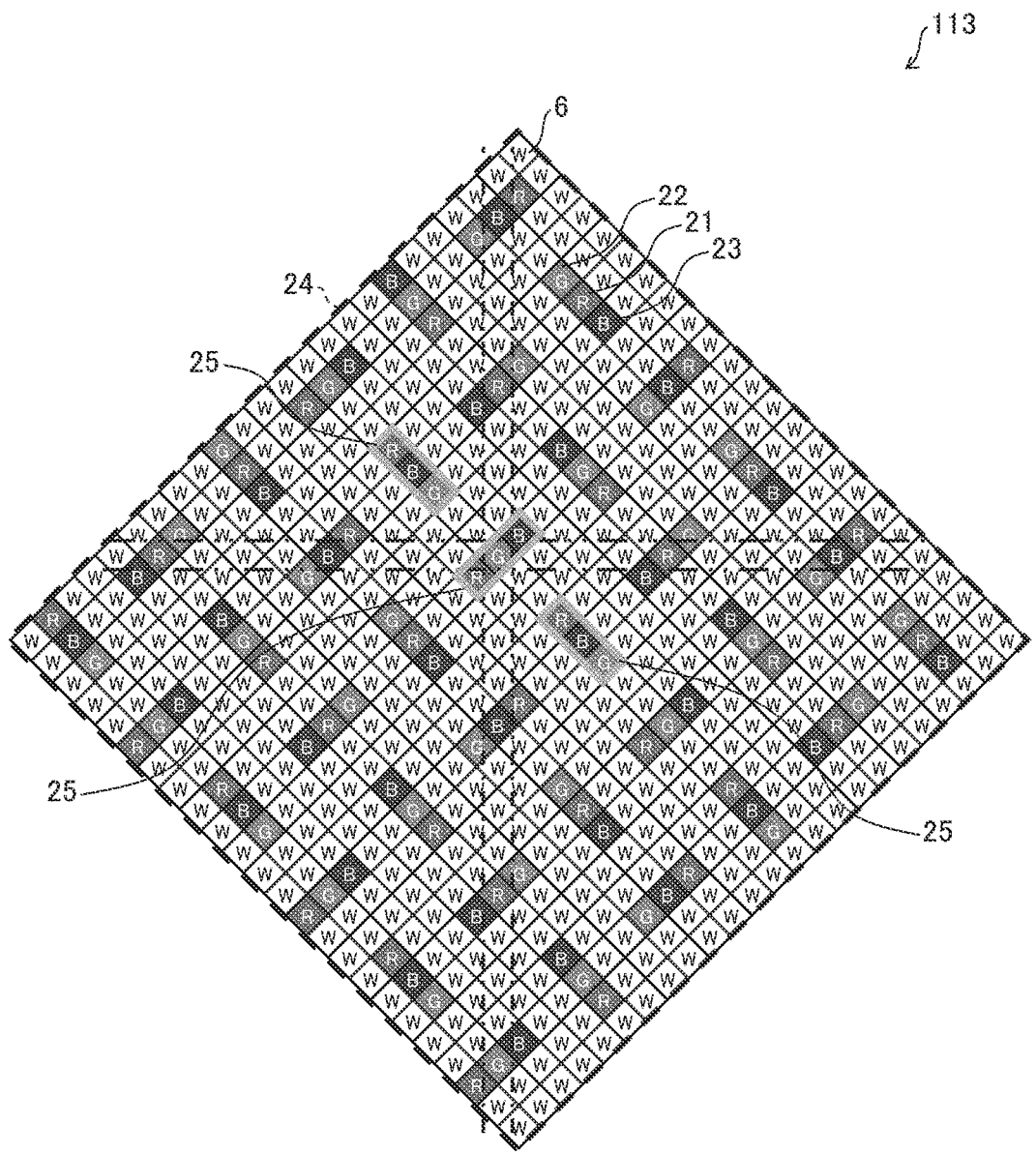
FIG. 22 is a plan view illustrating an arrangement of the plurality of first pixels and the plurality of second pixels according to the twelfth embodiment of the present disclosure.
Figure 23:
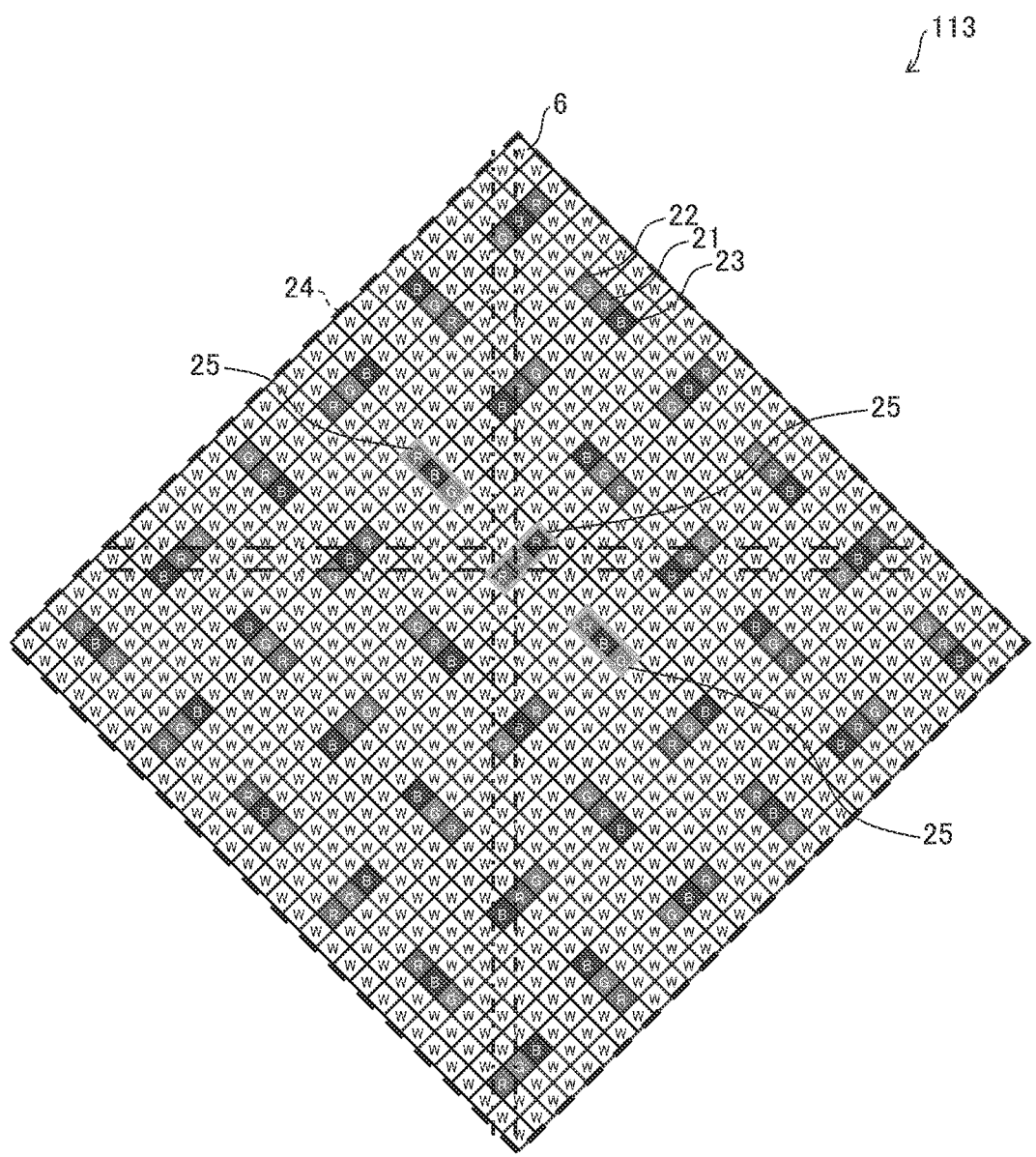
FIG. 23 is a plan view illustrating an arrangement of the plurality of first pixels and the plurality of second pixels according to the twelfth embodiment of the present disclosure.

FIG. 1 is a block diagram illustrating a schematic configuration of the solid-state imaging element 100 according to a twelfth embodiment of the present disclosure. Each of FIGS. 21 to 23 is a plan view illustrating an arrangement of the plurality of first pixels 5 and the plurality of second pixels 6 according to the twelfth embodiment of the present disclosure. Hereinafter, this arrangement is referred to as a pixel arrangement 113. The pixel arrangement 113 and the pixel arrangement 110 are different in the points below.

In the pixel arrangement 113, as seen in the pixel arrangement 106, the third pixels 21, the fourth pixels 22, and the fifth pixels 23 may be arranged alternately in the stated order in the vertical direction and the horizontal direction of the pixel arrangement 113. In a region of each of FIGS. 21 to 23 surrounded by a dash-dot-dash line, the third pixels 21, the fourth pixels 22, and the fifth pixels 23 are alternately arranged in the stated order upwards or downwards in the vertical direction. In a region of each of FIGS. 21 to 23 surrounded by a dash-dot-dash line, the third pixels 21, the fourth pixels 22, and the fifth pixels 23 are alternately arranged in the stated order from left to right, or from right to left, in the horizontal direction. In the vertical direction and the horizontal direction, the third pixels 21, the fourth pixels 22, and the fifth pixels 23 do not have to be arranged alternately in the stated order.

FIGS. 21 to 23 show the pixel arrangement 113 in three examples in total. FIG. 21 shows an example in which one of the plurality of second pixels 6 is disposed between neighboring two of the plurality of pixel groups 25. FIG. 22 shows an example in which two of the plurality of second pixels 6 are disposed between neighboring two of the plurality of pixel groups 25. FIG. 23 shows an example in which three of the plurality of second pixels 6 are disposed between neighboring two of the plurality of pixel groups 25.

Thirteenth Embodiment

An image processing device including the image processing unit 2 is also included in the scope of the present disclosure. The image processing device is provided to the solid-state imaging element 100 that synthesizes luminance signals and chrominance signals to obtain an image. The solid-state imaging element 100 includes a plurality of first pixels 5 and a plurality of second pixels 6. Each of the plurality of second pixels 6 has a spectral response characteristic in white. The image processing device: generates the chrominance signals, using output signals from the plurality of first pixels 5; and generates luminance signals, using output signals from the plurality of second pixels 6, without using the output signals from the plurality of first pixels 5.

An imaging method for the solid-state imaging element 100 is also included in the scope of the present disclosure.

The imaging method is executed by the solid-state imaging element 100 for synthesizing luminance signals and chrominance signals to obtain an image. The solid-state imaging element 100 includes a plurality of first pixels 5 and a plurality of second pixels 6. Each of the plurality of second pixels 6 has a spectral response characteristic in white. The imaging method includes: generating the chrominance signals, using output signals from the plurality of first pixels 5; and generating the luminance signals, using output signals from the plurality of second pixels 6, without using the output signals from the plurality of first pixels 5.

Modifications

As can be seen, in the embodiments of the present disclosure, each of the plurality of first pixels 5 may have the peak of the spectral response characteristic in a complementary color of the three primary colors of light. In other words, each of the plurality of first pixels 5 is any one of a cyan pixel, a magenta pixel, or a yellow pixel. The cyan pixel is a first pixel 5 having a peak of a spectral response characteristic in cyan. The magenta pixel is a first pixel 5 having a peak of a spectral response characteristic in magenta. The yellow pixel is a first pixel 5 having a peak of a spectral response characteristic in yellow. The same applies to the third pixels 21, the fourth pixels 22, and the fifth pixels 23.

Summary

A solid-state imaging element according to a first aspect of the present disclosure synthesizes luminance signals and chrominance signals to obtain an image. The solid-state imaging element includes a plurality of first pixels and a plurality of second pixels. Each of the plurality of second pixels has a spectral response characteristic in white. The solid-state imaging element generates the chrominance signals, using output signals from the plurality of first pixels. The solid-state imaging element generates the luminance signals, using output signals from the plurality of second pixels, without using the output signals from the plurality of first pixels.

The solid-state imaging element generates the luminance signals, without using the output signals from the plurality of first pixels whose spectral response characteristics are different from one another. Such a feature can reduce the risk that jaggies could appear on the periphery of an image because of chromatic aberration of an imaging lens that concentrates light onto the solid-state imaging element. As a result, the feature can provide the solid-state imaging element with high resolution.

In the solid-state imaging element, of a second aspect, according to the first aspect, the plurality of first pixels and the plurality of second pixels are arranged in a diagonal lattice.

In the solid-state imaging element, of a third aspect, according to the second aspect, one of the plurality of second pixels is disposed between neighboring two of the plurality of first pixels.

In the solid-state imaging element, of a fourth aspect, according to the second aspect, two or more of the plurality of second pixels are disposed between neighboring two of the plurality of first pixels.

In the solid-state imaging element, of a fifth aspect, according to the first aspect, the plurality of first pixels include: a plurality of third pixels having a peak of a spectral response characteristic in a first color; a plurality of fourth pixels having a peak of a spectral response characteristic in a second color; and a plurality of fifth pixels having a peak of a spectral response characteristic in a third color, and the plurality of first pixels and the plurality of second pixels are arranged in a pixel arrangement having a rectangular region including the third pixels, the fourth pixels, and the fifth pixels in equal pixel counts.

In the solid-state imaging element, of a sixth aspect, according to the fifth aspect, in a vertical direction and a horizontal direction of the pixel arrangement, the third pixels, the fourth pixels, and the fifth pixels are alternately arranged in a stated order.

In the solid-state imaging element, of a seventh aspect, according to the fifth or sixth aspect, the pixel arrangement includes a plurality of pixel groups arranged in a direction in which the plurality of first pixels and the plurality of second pixels are arranged, each of the plurality of pixel groups having a third pixel of the third pixels, a fourth pixel of the fourth pixels, and a fifth pixel of the fifth pixels, the third pixel, the fourth pixel, and the fifth pixel being arranged in a stated order, and, in each of the pixel groups, none of the second pixels is disposed between neighboring two of the third pixel, the fourth pixel, and the fifth pixel.

In the solid-state imaging element, of an eighth aspect, according to the seventh aspect, between neighboring two of the plurality of pixel groups, at least one of the plurality of second pixels is disposed.

The solid-state imaging element, of a ninth aspect of the present disclosure, according to any one of claims 1 to 8 further includes: a white-balance adjusting unit that performs white-balance adjustment processing on signals obtained from the output signals from the plurality of first pixels, and that omits the white-balance adjustment processing on signals obtained from the output signals from the plurality of second pixels; and a monochrome-interpolation processing unit that performs monochrome-interpolation processing on the signals obtained from the output signals from the plurality of second pixels, and that omits the monochrome-interpolation processing on the signals obtained from the output signals from the plurality of first pixels.

A camera module according to a tenth aspect of the present disclosure includes the solid-state imaging element according to any one of the first to ninth aspects.

An image processing device according to an eleventh aspect of the present disclosure is provided to a solid-state imaging element that synthesizes luminance signals and chrominance signals to obtain an image. The solid-state imaging element includes a plurality of first pixels and a plurality of second pixels. Each of the plurality of second pixels has a spectral response characteristic in white. The image processing device: generates the chrominance signals, using output signals from the plurality of first pixels; and generates luminance signals, using output signals from the plurality of second pixels, without using the output signals from the plurality of first pixels.

An imaging method, according to a twelfth aspect of the present disclosure, executed by a solid-state imaging element for synthesizing luminance signals and chrominance signals to obtain an image. The solid-state imaging element includes a plurality of first pixels and a plurality of second pixels. Each of the plurality of second pixels has a spectral response characteristic in white. The imaging method includes: generating the chrominance signals, using output signals from the plurality of first pixels; and generating the luminance signals, using output signals from the plurality of second pixels, without using the output signals from the plurality of first pixels.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined to achieve a new technical feature.

What is claimed is:

1. A solid-state imaging element that synthesizes luminance signals and chrominance signals to obtain an image, the solid-state imaging element comprising:
    a plurality of first pixels and a plurality of second pixels;
    a white-balance adjusting unit; and
    a monochrome-interpolation processing unit,
    wherein each of the plurality of second pixels has a spectral response characteristic in white,
    the solid-state imaging element generates the chrominance signals using output signals from the plurality of first pixels,
    the solid-state imaging element further generates the luminance signals using output signals from the plurality of second pixels without using the output signals from the plurality of first pixels,
    the white-balance adjusting unit is configured to perform white-balance adjustment processing on signals obtained from the output signals from the plurality of first pixels, and to omit the white-balance adjustment processing on signals obtained from the output signals from the plurality of second pixels, and
    the monochrome-interpolation processing unit is configured to perform monochrome-interpolation processing on the signals obtained from the output signals from the plurality of second pixels, and to omit the monochrome-interpolation processing on the signals obtained from the output signals from the plurality of first pixels.

2. The solid-state imaging element according to claim 1, wherein the plurality of first pixels and the plurality of second pixels are arranged in a diagonal lattice.

3. The solid-state imaging element according to claim 2, wherein one of the plurality of second pixels arranged in the diagonal lattice is disposed between two neighboring first pixels of the plurality of first pixels.

4. The solid-state imaging element according to claim 2, wherein two or more of the plurality of second pixels arranged in the diagonal lattice are disposed between two neighboring first pixels of the plurality of first pixels.

5. The solid-state imaging element according to claim 1, wherein the plurality of first pixels includes: a plurality of third pixels having a peak of a spectral response characteristic in a first color; a plurality of fourth pixels having a peak of a spectral response characteristic in a second color; and a plurality of fifth pixels having a peak of a spectral response characteristic in a third color, and
    the plurality of first pixels and the plurality of second pixels are arranged in a pixel arrangement having a rectangular region, the rectangular region including the plurality of third pixels, the plurality of fourth pixels, and the plurality of fifth pixels in equal pixel counts.

6. The solid-state imaging element according to claim 5, wherein, in a vertical direction and a horizontal direction of the pixel arrangement, the plurality of third pixels, the plurality of fourth pixels, and the plurality of fifth pixels are alternately arranged in a stated order.

7. The solid-state imaging element according to claim 5, wherein the pixel arrangement includes a plurality of pixel groups arranged in a direction in which the plurality of first pixels and the plurality of second pixels are arranged, each of the plurality of pixel groups having a third pixel of the plurality of third pixels, a fourth pixel of the plurality of fourth pixels, and a fifth pixel of the plurality of fifth pixels, the third pixel, the fourth pixel, and the fifth pixel are arranged in a stated order, and in each of the plurality of pixel groups, none of the plurality of second pixels is disposed between two neighboring pixels among the third pixel, the fourth pixel, and the fifth pixel.

8. The solid-state imaging element according to claim 7, wherein at least one of the plurality of second pixels is disposed between two neighboring pixel groups of the plurality of pixel groups.

9. A camera module comprising the solid-state imaging element according to claim 1.

10. An image processing device provided to a solid-state imaging element that synthesizes luminance signals and chrominance signals to obtain an image, the solid-state imaging element including
   a plurality of first pixels and a plurality of second pixels, and
   each of the plurality of second pixels having a spectral response characteristic in white,
the image processing device configured to:
   generate the chrominance signals using output signals from the plurality of first pixels;
   generate luminance signals using output signals from the plurality of second pixels without using the output signals from the plurality of first pixels;
   perform white-balance adjustment processing on signals obtained from the output signals from the plurality of first pixels, and omit the white-balance adjustment processing on signals obtained from the output signals from the plurality of second pixels; and
   perform monochrome-interpolation processing on the signals obtained from the output signals from the plurality of second pixels, and omit the monochrome-interpolation processing on the signals obtained from the output signals from the plurality of first pixels.

11. An imaging method executed by a solid-state imaging element for synthesizing luminance signals and chrominance signals to obtain an image, the solid-state imaging element including
   a plurality of first pixels and a plurality of second pixels, and
   each of the plurality of second pixels having a spectral response characteristic in white,
the imaging method comprising:
   generating the chrominance signals using output signals from the plurality of first pixels;
   generating the luminance signals using output signals from the plurality of second pixels without using the output signals from the plurality of first pixels;
   performing white-balance adjustment processing on signals obtained from the output signals from the plurality of first pixels, and omitting the white-balance adjustment processing on signals obtained from the output signals from the plurality of second pixels; and
   performing monochrome-interpolation processing on the signals obtained from the output signals from the plurality of second pixels, and omitting the monochrome-interpolation processing on the signals obtained from the output signals from the plurality of first pixels.

* * * * *